United States Patent
Selvamanickam

(10) Patent No.: US 7,387,811 B2
(45) Date of Patent: Jun. 17, 2008

(54) METHOD FOR MANUFACTURING HIGH TEMPERATURE SUPERCONDUCTING CONDUCTORS USING CHEMICAL VAPOR DEPOSITION (CVD)

(75) Inventor: Venkat Selvamanickam, Wynantskill, NY (US)

(73) Assignee: Superpower, Inc., Schenectady, NY (US)

( * ) Notice: Subject to any disclaimer, the term of this patent is extended or adjusted under 35 U.S.C. 154(b) by 82 days.

(21) Appl. No.: 10/946,443

(22) Filed: Sep. 21, 2004

(65) Prior Publication Data

US 2006/0062900 A1    Mar. 23, 2006

(51) Int. Cl.
*B05D 5/12*    (2006.01)
*H01L 39/24*    (2006.01)

(52) U.S. Cl. .................. 427/62; 29/599; 505/434; 505/447; 505/470; 505/473; 505/477; 505/732

(58) Field of Classification Search .................. 427/62; 29/599; 505/434, 447, 470, 473–477, 732; 204/192.15, 192.24

See application file for complete search history.

(56) References Cited

U.S. PATENT DOCUMENTS

| | | | |
|---|---|---|---|
| 3,132,046 A * | 5/1964 | Mann | 427/504 |
| 3,916,822 A * | 11/1975 | Robinson | 118/725 |
| 3,933,028 A | 1/1976 | Laud et al. | |
| 4,001,758 A | 1/1977 | Esper et al. | |
| 4,004,452 A | 1/1977 | Logothetis et al. | |
| 4,344,127 A | 8/1982 | McDaniel et al. | |
| 4,396,976 A | 8/1983 | Hyatt | |
| 4,413,502 A | 11/1983 | Ohta et al. | |
| 4,443,781 A | 4/1984 | Ohta et al. | |
| 4,450,428 A | 5/1984 | Ohta et al. | |
| 4,453,397 A | 6/1984 | Ohta et al. | |
| 4,646,223 A | 2/1987 | Sekiguchi | |
| 4,777,022 A | 10/1988 | Boldish et al. | |
| 4,916,600 A | 4/1990 | Ropelato | |
| 4,949,669 A | 8/1990 | Ishii et al. | |
| 4,982,019 A * | 1/1991 | Purdy et al. | 568/842 |
| 5,059,770 A | 10/1991 | Mahawili | |
| 5,204,314 A | 4/1993 | Kirlin et al. | |
| 5,206,216 A * | 4/1993 | Yoshida | 505/434 |
| 5,324,361 A | 6/1994 | Etzkorn et al. | |
| 5,329,097 A | 7/1994 | Jones et al. | |
| 5,351,200 A | 9/1994 | Impink, Jr. | |
| 5,441,703 A | 8/1995 | Jurgensen | |
| 5,447,569 A * | 9/1995 | Hiskes et al. | 118/726 |

(Continued)

FOREIGN PATENT DOCUMENTS

EP    0272140 A2    6/1988

(Continued)

*Primary Examiner*—Brian K. Talbot
(74) *Attorney, Agent, or Firm*—Larson Newman Abel Polansky & White, LLP

(57) ABSTRACT

A CVD apparatus capable of substantially simultaneously processing multiple portions of at least one substrate or substantially simultaneously processing portions of multiple substrates or substantially simultaneously processing multiple portions of at least one substrate and portions of multiple substrates, the CVD apparatus is described. The CVD apparatus includes a reactor, at least one substrate heater, at least one precursor supply system, at least one precursor injector, optionally, communicating with at least one temperature regulated manifold, at least one reactants mixer, and, optionally, at least one controller communicating with at least one substrate heater, the at least one precursor supply system, the at least one precursor injector, the at least one temperature regulated manifold, and combinations thereof.

4 Claims, 8 Drawing Sheets

Figure 2a Front View of Substrate Heater With Showerhead

U.S. PATENT DOCUMENTS

| | | | |
|---|---|---|---|
| 5,536,323 A | 7/1996 | Kirlin et al. | |
| 5,554,224 A | 9/1996 | Foltyn | |
| 5,579,218 A | 11/1996 | Ehlig et al. | |
| 5,595,606 A | 1/1997 | Fujikawa et al. | |
| 5,622,606 A | 4/1997 | Kügler et al. | |
| 5,624,498 A | 4/1997 | Lee et al. | |
| 5,648,006 A | 7/1997 | Min et al. | |
| 5,653,806 A | 8/1997 | Van Buskirk et al. | |
| 5,689,415 A | 11/1997 | Calotychos et al. | |
| 5,711,816 A | 1/1998 | Kirlin et al. | |
| 5,726,912 A | 3/1998 | Krall, Jr. et al. | |
| 5,739,086 A | 4/1998 | Goyal et al. | |
| 5,741,377 A | 4/1998 | Goyal et al. | |
| 5,766,363 A | 6/1998 | Mizuno et al. | |
| 5,783,153 A | 7/1998 | Logothetis et al. | |
| 5,820,678 A | 10/1998 | Hubert et al. | |
| 5,869,744 A | 2/1999 | Suzuki et al. | |
| 5,872,080 A | 2/1999 | Arendt et al. | |
| 5,876,673 A | 3/1999 | Logothetis et al. | |
| 5,898,020 A | 4/1999 | Goyal et al. | |
| 5,908,507 A * | 6/1999 | Onabe et al. | 118/718 |
| 5,919,310 A | 7/1999 | Fujioka et al. | |
| 5,942,674 A | 8/1999 | Logothetis et al. | |
| 5,958,599 A | 9/1999 | Goyal et al. | |
| 5,964,966 A | 10/1999 | Goyal et al. | |
| 5,980,078 A | 11/1999 | Krivoshein et al. | |
| 6,010,748 A | 1/2000 | Van Buskirk et al. | |
| 6,022,832 A | 2/2000 | Fritzemeier et al. | |
| 6,027,564 A | 2/2000 | Fritzemeier et al. | |
| 6,066,836 A | 5/2000 | Chen et al. | |
| 6,106,615 A | 8/2000 | Goyal et al. | |
| 6,132,512 A * | 10/2000 | Horie et al. | 118/715 |
| 6,156,376 A | 12/2000 | Paranthaman et al. | |
| 6,196,251 B1 | 3/2001 | Roehle | |
| 6,206,972 B1 | 3/2001 | Dunham | |
| 6,232,580 B1 | 5/2001 | Sandhu | |
| 6,245,192 B1 | 6/2001 | Dhindsa et al. | |
| 6,294,026 B1 | 9/2001 | Roithner et al. | |
| 6,331,199 B1 | 12/2001 | Goyal et al. | |
| 6,383,989 B2 | 5/2002 | Jia et al. | |
| 6,426,320 B1 | 7/2002 | Fritzemeier et al. | |
| 6,447,714 B1 | 9/2002 | Goyal et al. | |
| 6,451,450 B1 | 9/2002 | Goyal et al. | |
| 6,458,223 B1 | 10/2002 | Hans Thieme et al. | |
| 6,475,311 B1 | 11/2002 | Fritzemeier et al. | |
| 6,477,980 B1 | 11/2002 | White et al. | |
| 6,537,419 B1 | 3/2003 | Kinnard | |
| 6,541,121 B2 | 4/2003 | Usoskin et al. | |
| 6,541,136 B1 | 4/2003 | Kwon et al. | |
| 6,553,932 B2 | 4/2003 | Liu et al. | |
| 6,562,761 B1 | 5/2003 | Fritzemeier et al. | |
| 6,599,346 B2 | 7/2003 | Goyal et al. | |
| 6,602,313 B2 | 8/2003 | Goyal et al. | |
| 6,607,838 B2 | 8/2003 | Goyal et al. | |
| 6,607,839 B2 | 8/2003 | Goyal et al. | |
| 6,610,413 B2 | 8/2003 | Goyal et al. | |
| 6,610,414 B2 | 8/2003 | Goyal et al. | |
| 6,610,632 B2 | 8/2003 | Honjo et al. | |
| 2001/0056041 A1 | 12/2001 | Jia et al. | |
| 2002/0192377 A1 | 12/2002 | Bartholomew et al. | |
| 2003/0036483 A1 | 2/2003 | Arendt et al. | |
| 2004/0060514 A1 | 4/2004 | Janakiraman et al. | |
| 2004/0065657 A1 | 4/2004 | Adams et al. | |
| 2004/0163597 A1 | 8/2004 | Lee et al. | |
| 2005/0223984 A1 * | 10/2005 | Lee et al. | 118/715 |

FOREIGN PATENT DOCUMENTS

| | | |
|---|---|---|
| EP | 1103632 A1 | 5/2001 |
| EP | 1349968 | 7/2002 |
| EP | 1386981 A1 | 2/2004 |
| JP | 61263118 | 11/1986 |
| JP | 8291385 | 11/1996 |
| WO | WO96/28585 A | 9/1996 |
| WO | WO 0240741 | 5/2002 |
| WO | WO 03060186 | 7/2003 |
| WO | WO2004/007353 A2 | 1/2004 |
| WO | WO2006/004579 A2 | 1/2006 |

* cited by examiner

Figure 2a Front View of Substrate Heater With Showerhead

Figure 2b Side View of Substrate Heater With Showerhead

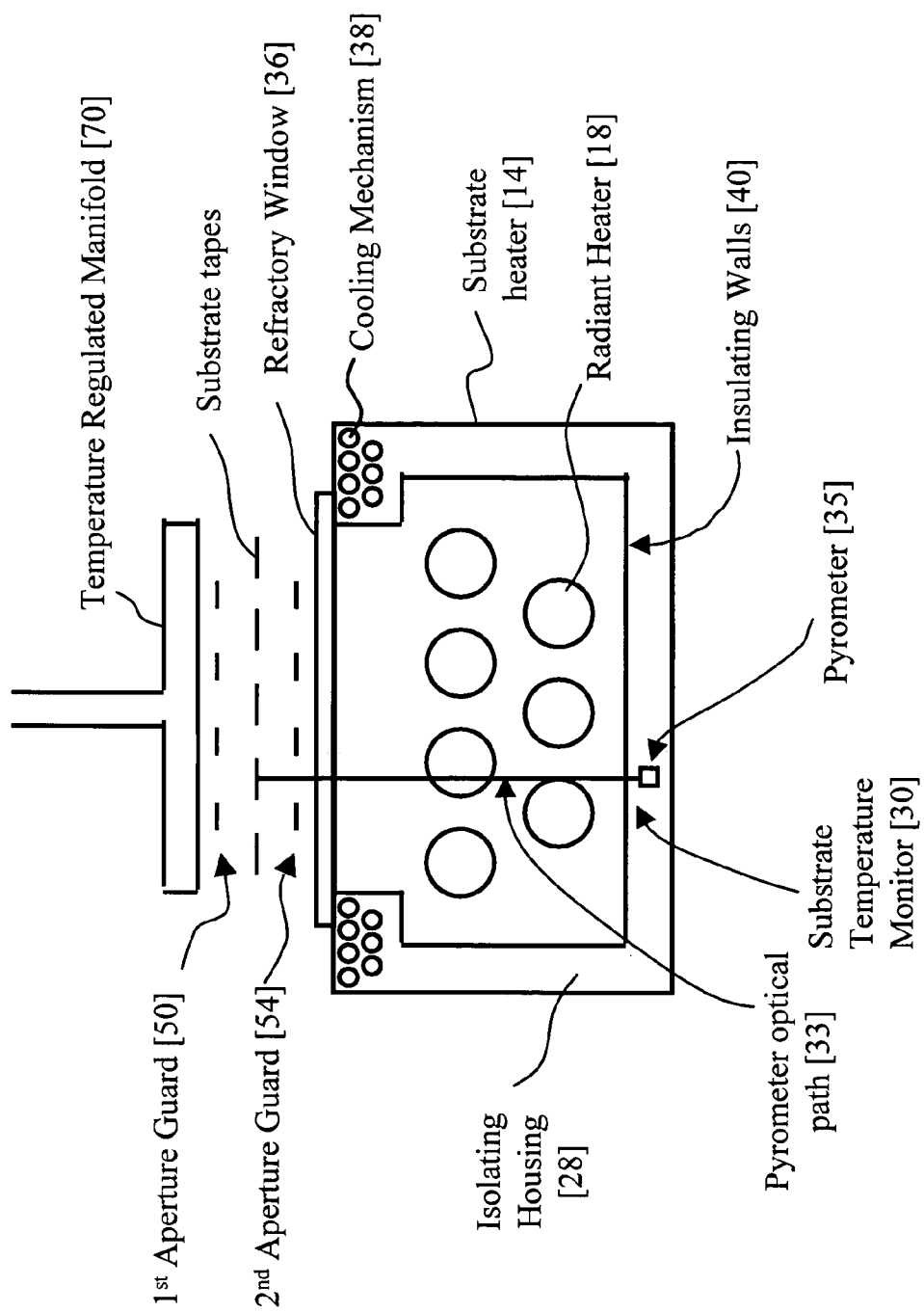
Figure 3 Cross-Sectional View of Substrate Heater With Temperature Regulated Manifold

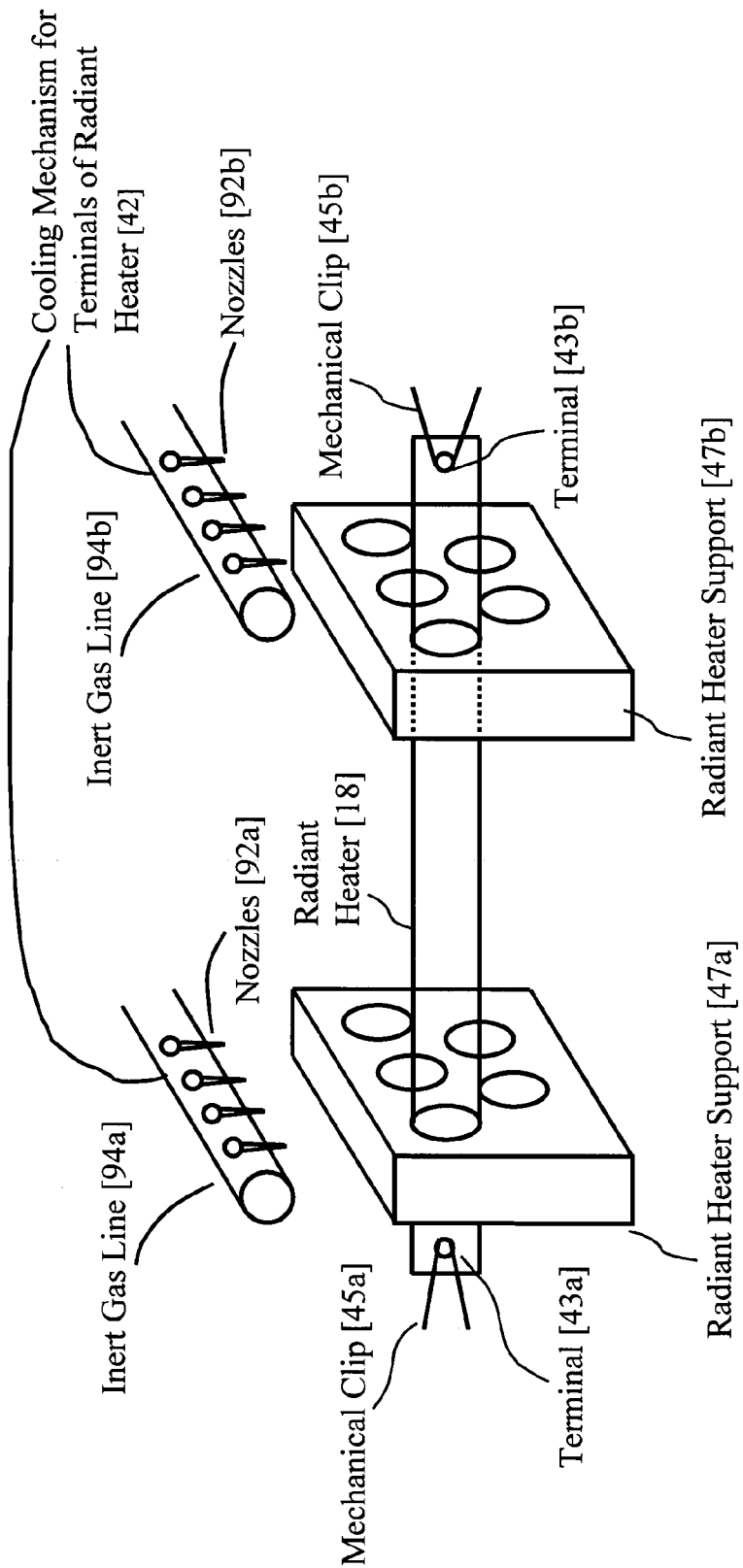
Figure 4 Substrate Heater

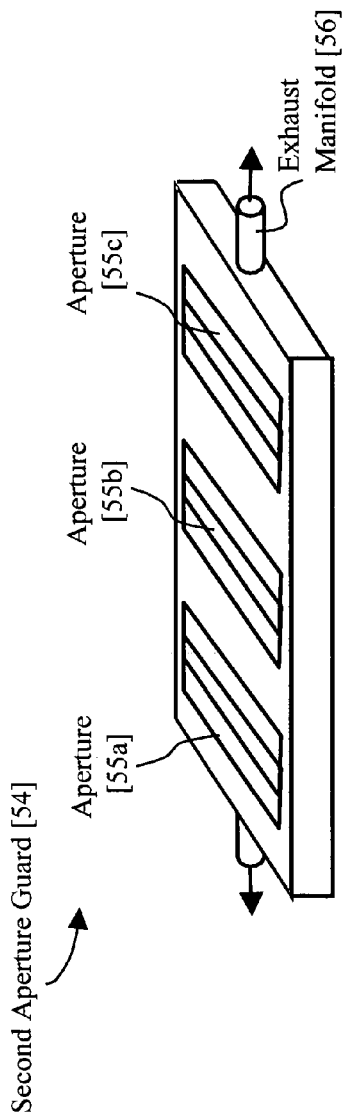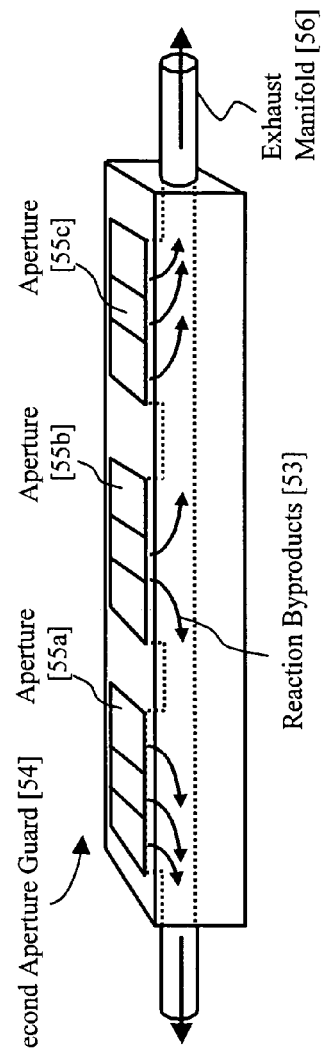
Figure 5a Top View of Second Aperture Guard
Figure 5b Cross-Sectional View of Second Aperture Guard Figure 6 – Cross-Sectional View of Temperature Regulated Manifold Figure 7 – Cross-Sectional View of Showerhead Assembly

METHOD FOR MANUFACTURING HIGH TEMPERATURE SUPERCONDUCTING CONDUCTORS USING CHEMICAL VAPOR DEPOSITION (CVD)

The present invention relates generally to a chemical vapor deposition (CVD) apparatus and, more particularly, to a CVD apparatus capable of continuously forming a superconducting material on the surface of an elongate substrate to manufacture superconducting conductors. The CVD apparatus is capable of continuously forming a non-superconducting oxide material on the surface of an elongate substrate that also may be used to manufacture superconducting conductors.

BACKGROUND OF INVENTION

In the past three decades, electricity has risen from 25% to 40% of end-use energy consumption in the United States. With this rising demand for power comes an increasingly critical requirement for highly reliable, high quality power. As power demands continue to grow, older urban electric power systems in particular are being pushed to the limit of performance, requiring new solutions.

Metal conductors, such as copper and aluminum, form a foundation of the world's electric power system, including generators, transmission and distribution systems, transformers, and motors. The discovery of high-temperature superconducting (HTS) compounds in 1986 has led to an effort to develop conductors incorporating HTS compounds for the power industry to replace metal conductors. HTS conductors are one of the most fundamental advances in electric power system technology in more than a century.

HTS conductors can carry over one hundred times more current than conventional metal conductors of the same physical dimension. The superior power density of HTS conductors will enable the development of a new generation of power industry technologies. HTS conductors offer major size, weight, efficiency, and environmental benefits. HTS technologies will drive down costs and increase the capacity and reliability of electric power systems in a variety of ways. For example, an HTS conductor is capable of transmitting two to five times more power through existing rights-of-way, thus improving the performance of power grids while reducing their environmental footprint.

For HTS technology to become commercially viable for use in the power generation and distribution industry, it will be necessary to develop equipment for continuous, high-throughput production of HTS conductors.

One way to characterize HTS conductors is by their cost per meter. An alternative way to characterize HTS conductors is by cost per kiloamp-meter. That is, by increasing the current-carrying capacity for a given cost per meter of an HTS conductor, the cost per kiloamp-meter is reduced. This is demonstrated in the critical current density (Jc) of the deposited HTS material multiplied by the cross-sectional area of the material.

For a given critical current and width of HTS material, one way to increase the cross-sectional area is to increase the HTS material thickness. However, under conventional process parameters, it has been demonstrated that with critical current density as a function of thickness, the critical current density drops off as the thickness of a single layer of HTS material increases beyond approximately 1.5 microns and may reach saturation. This is because beyond a film thickness of approximately 1.5 microns, the HTS material becomes very porous, develops voids, and develops increased surface roughness, all of which contribute to inhibiting the flow of current.

Chemical vapor deposition (CVD) is a process that shows promise for the high throughput necessary to cost-effectively produce HTS conductors. During CVD, HTS material, such as yttrium-barium-copper-oxide ($YBa_2Cu_3O_7$ or "YBCO"), may be deposited by vapor-phase precursors onto a heated substrate via chemical reactions that occur at the surface of the substrate. Also, CVD and, particularly, metalorganic chemical vapor deposition (MOCVD), is an attractive process for fabrication of HTS-coated conductors at a high throughput. High throughput is partly enabled by large deposition areas that are possible with MOCVD.

However, there are several issues that need to be resolved for the uniform deposition of HTS materials over large areas on continuously moving substrates including precursor uniformity, precursor waste, and substrate temperature uniformity. Injecting a precursor uniformly for an extended time over a large deposition area of a heated substrate, in particular a moving substrate, can be especially difficult. Further, obtaining sufficiently high conversion of precursor to HTS material formed on is a challenge in particular so as to avoid waste of expensive precursors and increase deposition rate. Also, depositing HTS material on a moving substrate within the preferred temperature window is challenging.

Thus, there remains a need for a new and improved CVD apparatus that is capable of continuously and uniformly forming a superconducting material and non-superconducting material on the surface of an elongate substrate, especially on continuously moving substrate, to manufacture superconducting conductors.

BRIEF SUMMARY OF INVENTION

The present invention meets these and other needs by providing a CVD apparatus capable of substantially simultaneously processing multiple portions of at least one substrate or substantially simultaneously processing portions of multiple substrates or substantially simultaneously processing multiple portions of at least one substrate and portions of multiple substrates. The CVD apparatus includes a reactor, at least one substrate heater, at least one precursor supply system, at least one precursor injector, optionally, communicating with at least one temperature regulated manifold, at least one reactants mixer, and, optionally, at least one controller communicating with at least one substrate heater, the at least one precursor supply system, the at least one precursor injector, the at least one temperature regulated manifold, and combinations thereof.

The CVD apparatus may further include at least one sensor that, when at least one controller is included, may be used to regulate an operation of the CVD apparatus. Examples of the at least one sensor include, without limitation, at least one of a temperature sensor, a pressure sensor, a vacuum sensor, a speed sensor, and combinations thereof. In this manner, the at least one controller may regulate any one of the at least one substrate heater, the at least one precursor supply system, the at least one precursor injector, a translation of a substrate, at least one apertured guard, and one or combinations thereof. Further, the CVD apparatus may include at least one vacuum system.

To facilitate the providing and/or manipulating of a substrate, the CVD apparatus may further include at least one substrate handler. For example, the at least one substrate handler may be a translation mechanism, such as, for example, any one of at least one conveyor, at least one reel-to-reel unit, at least one robotic translator, and at least one combination thereof.

Turning now to at least one substrate heater of the CVD apparatus, it includes at least one radiant heater, such as, for example, at least one lamp. Further, at least one substrate heater may include at least one isolating housing that may further include at least one cooling mechanism. The at least one cooling mechanism could be a gaseous cooling, such as, for example, directed at the at least one radiant heater.

Also, the at least one substrate heater may include at least one insulating wall and/or at least one refractory window. One example of an at least one refractory window is quartz. The at least one refractory window protects the at least one radiant heater from at least one of reactants, reaction products, and combinations thereof. The at least one substrate heater may be at least one multiple zone heater capable of maintaining a translating substrate tape at a substantially isothermal temperature in a deposition zone of the CVD apparatus. In such case, the at least one substrate heater further may include at least one temperature monitor. In turn, the at least one substrate heater further may include at least one temperature controller communicating with the at least one temperature monitor. An example of the at least one temperature monitor includes at least one thermocouple.

When the at least one substrate heater is an at least one multiple zone heater, a first heating zone may be a preheating zone capable of heating a translating substrate to substantially the deposition temperature, a second heating zone may be capable of maintaining a translating substrate at substantially the deposition temperature, and a final heating zone may be capable of rapidly cooling a translating substrate to substantially below the deposition temperature. Further, the CVD apparatus may include at least one substrate temperature monitor, such as, for example, a pyrometer.

Returning now to the at least one substrate heater, its isolating housing may be at least one radiant heater support. Also, a longitudinal axis of the isolating housing may be substantially parallel to a longitudinal axis of a translating substrate. Also, the at least one radiant heater further may include at least one cooling mechanism for the at least one terminal of the at least one radiant heater.

Returning now to the CVD apparatus, it according may include at least one exhaust mechanism capable of communicating with the multiple portions of at least one substrate or the portions of multiple substrates or the multiple portions of at least one substrate and portions of multiple substrates so as to be capable of removing at least one of reactants, reaction products, reaction byproducts, and combination thereof.

For example, the CVD apparatus may include at least one first apertured guard between the at least one precursor injector and at least one substrate. At least one aperture of the at least one first apertured guard may be variable. Further, the at least one first apertured guard may include at least one exhaust manifold. In turn, the at least one exhaust manifold may communicates with at least one vacuum system. In this manner, the at least one exhaust manifold may be capable of removing at least one of reactants, reaction products, reaction byproducts, and at least one combination thereof.

Alternatively or in addition, the at least one first apertured guard between the precursor injector and the at least one substrate may be capable of directing gaseous reactants from the precursor injector to the at least one substrate. Likewise, the one first apertured guard may be capable of shielding the at least one precursor injector from at least one radiant heat.

In addition to the at least one first apertured guard, the CVD apparatus further may include at least one second apertured guard between the at least one substrate and the at least one substrate heater. As with the at least one first apertured guard, at least one aperture of the at least second apertured guard may be variable. Further, the at least second apertured guard may include the at least one exhaust manifold. In turn, the at least one exhaust manifold may communicate with at least one vacuum system. In this manner, the at least one exhaust manifold may be capable of removing at least one of reactants, reaction products, reaction byproducts, and at least one combination thereof. Alternatively or additionally, at least one aperture may be capable of directing radiant heat from the at least one substrate heater toward at least one substrate.

Turning now to the precursor injector, it further may include at least one precursor source, such as, for example, at least one solid source that may be in the form of at least one powder. Alternatively or additionally, the at least one precursor source may be at least one source liquid, such as, for example, at least one solution of THS and THD. Further, the precursor injector may include at least one delivery mechanism, such as, for example, at least one pump when the at least one source is liquid or at least one mill and at least one conveyor when the at least one source is solid.

The precursor injector further may include at least one vaporizer that in turn further may include at least one carrier fluid, such as for example, at least one inert gas that may include at least one of argon, nitrogen, and at least one combination of argon and nitrogen.

At least one reactants mixer may be within the at least one temperature regulated manifold of the precursor injector. The at least one reactants mixer may be the at least one temperature regulated manifold. Alternatively, the at least one reactants mixer may be outside of the at least one temperature regulated manifold. No matter its location, the at least one reactant mixer may be at least one oxygen injector communicating with a precursor carrier line.

Turning now to the at least one temperature regulated manifold, it may include at least one of at least one cooling coil and at least one heating coil. The at least one heating coil may heat the at least one precursor carrier line. Also, the at least one heating coil may heat the at least one oxygen injector.

Further, the precursor injector may include at least one gaseous reactant containment mechanism, such as for example, at least one gas that blankets at least one substrate. Such at least one gas may be at least one inert gas, such as, for example, at least one of argon, nitrogen, and at least one combination thereof.

Additionally, the at least one temperature regulated manifold of the precursor injector may include a plurality of orifices for directing the at least one reactant mixture toward at least one substrate.

Accordingly, one aspect of the present invention is to provide a CVD apparatus capable of substantially simultaneously processing multiple portions of at least one substrate or substantially simultaneously processing portions of multiple substrates or substantially simultaneously processing multiple portions of at least one substrate and portions of multiple substrates. The CVD apparatus includes a reactor, at least one substrate heater, at least one precursor supply system, at least one precursor injector, and at least one temperature regulated manifold.

Another aspect of the present invention is to provide a precursor injector useable in a CVD apparatus capable of substantially simultaneously processing multiple portions of at least one substrate or substantially simultaneously processing portions of multiple substrates or substantially simultaneously processing multiple portions of at least one substrate and portions of multiple substrates. The CVD apparatus includes a reactor, at least one substrate heater, and at least one precursor supply system. The precursor injector includes at least one temperature regulated manifold and at least one reactants mixer.

Still another aspect of the present invention is to provide a CVD apparatus capable of substantially simultaneously processing multiple portions of at least one substrate or substantially simultaneously processing portions of multiple substrates or substantially simultaneously processing multiple portions of at least one substrate and portions of multiple substrates. The CVD apparatus includes a reactor, at least one substrate heater, at least one precursor supply system, at least one precursor injector, at least one temperature regulated manifold, at least one reactants mixer, and at least one controller communicating with at least one substrate heater, the at least one precursor supply system, the at least one precursor injector, the at least one temperature regulated manifold, and combinations thereof.

These and other aspects, advantages, and salient features of the present invention will become apparent from the following detailed description, the accompanying drawings, and the appended claims.

BRIEF DESCRIPTION OF DRAWINGS

FIG. 3 is a schematic illustrating a cross-sectional front view of a temperature regulated manifold of a precursor injector, a first apertured guard, a second apertured guard, and a substrate heater usable in the CVD apparatus of FIG. 1;

FIG. 4 is a schematic illustrating aspects of the a substrate heater usable of FIG. 4 usable in the CVD apparatus of FIG. 1; and FIG. 5a is a schematic illustrating a top view of aspects of a second apertured guard usable in the CVD apparatus of FIG. 1;

FIG. 5b is a schematic illustrating a side view of aspects of a second apertured guard usable in the CVD apparatus of FIG. 1;

DETAILED DESCRIPTION

Figure 1:
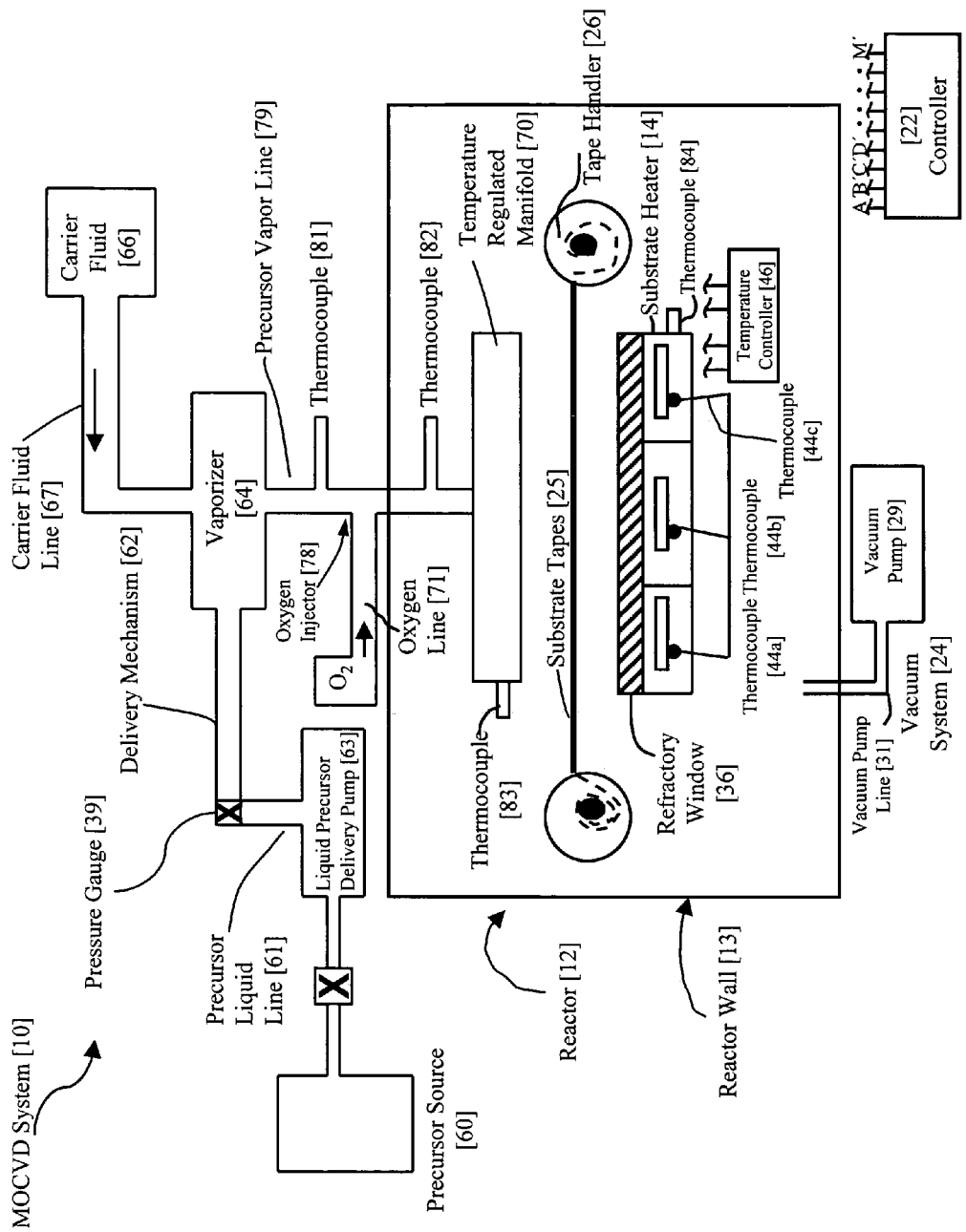
FIG. 1 is a schematic illustrating a CVD apparatus constructed according to the present invention.

In the following description, like reference characters designate like or corresponding parts throughout the several views shown in the figures. It is also understood that terms such as "top," "bottom," "outward," "inward," and the like are words of convenience and are not to be construed as limiting terms.

Referring to the drawings in general and to FIG. 1 in particular, it will be understood that the illustrations are for the purpose of describing a preferred embodiment of the invention and are not intended to limit the invention thereto. FIG. 1 shows a simplified CVD apparatus 10 according to the present invention. CVD apparatus 10 includes a precursor source 60, a carrier fluid line 67, a liquid precursor delivery pump 63, a pressure gauge 39, a precursor liquid line 61, a vaporizer 64, a thermocouple 81, an oxygen line 71, an oxygen injector 78, a thermocouple 82, a precursor vapor line 79, a temperature regulated manifold 70, a thermocouple 83, a tape handler 26, elongate substrates 25, a substrate heater 14, a refractory window 36, a thermocouple 84, a vacuum pump 29, a vacuum 36, a vacuum pump line 31, controllers 22 and subcontroller 46, a reactor 12, and a reactor wall 13.

The carrier fluid line 67 may be a tube or pipe through which an inert carrier gas, such as, for example, argon, passes. Alternately, nitrogen may be substituted as the inert carrier gas.

The liquid precursor delivery pump 63 is a liquid precursor delivery pump capable of a low flow rate between about 0.1 and about 10 mL/min. The liquid precursor delivery pump 63 may be a high-pressure, low flow rate pump such as a High Pressure Liquid Chromatography (HPLC) pump.

The pressure gauge 39 may be an element that allows monitoring of the delivery pressure of the liquid precursor prior to its entrance into the vaporizer 64.

The precursor liquid line 61 may be a tube or pipe through which the liquid precursors pass and may serve as a connection between the liquid precursor delivery pump 63 and the vaporizer 64.

In the vaporizer 64, a solution containing the organometallic precursors (such as, for example, containing one or more of yttrium, barium, and copper, along with an appropriate mixture of solvents) is flash vaporized. An inert carrier gas, such as, for example, argon, sweeps the flash vaporized organometallic precursors from the vaporizer 64 for delivery to the reactor 12. The inert carrier gas is introduced to the vaporizer 64 by the carrier fluid line 67.

An example of a temperature monitor 44 in CVD apparatus 10 includes the thermocouple 81, the thermocouple 82, the thermocouple 83, and the thermocouple 84. Each temperature monitor 44 provides temperature readings from preselected points within the CVD apparatus 10.

The precursor vapor line 79 may be a tube or pipe through which the precursor vapor and carrier gas mixture passes on its way to the reactor 12. The precursor vapor line 79 may be heated by a heating coil or jacket.

The oxygen line 71 may be a tube or pipe through which oxygen passes prior to its introduction to the precursor vapor and carrier gas mixture within the precursor vapor line 79. A number of ways to introduce oxygen to the precursor vapor and carrier gas mixture are discussed below. The oxygen line 71 may be heated by a heating coil or jacket.

The temperature regulated manifold 70 is an assembly serving to disperse oxygen and the carrier gas and precursor vapor mixture over the deposition zone as may be defined by the dimensions of the substrate heater 14 and the temperature regulated manifold 70. The temperature regulated manifold 70 may include both a heating jacket and a cooling jacket. A detail description of a temperature regulated manifold 70 is provided in reference to FIGS. 5 and 6.

The substrate heater 14 may be a multi-zone radiant heater that serves to achieve a deposition temperature in one or more translating elongate substrates 25. A substrate heater 14 is described in detail in reference to the FIGS. 3 and 4. The dimensions of a substrate heater 14 may be used to define a desired size of a deposition zone. A substrate heater 14 and an associated temperature regulated manifold 70 are adapted in a manner that matches the size of an associated deposition zone.

The vacuum pump 29 may be a roughing pump and may serve to achieve the deposition pressure within the reactor 12, typically between about one and about five Torr. The vacuum pump 29 is in communication with the reactor 12 via the vacuum pump line 31 and also may be in communication with any one of a first apertured guard 50, second apertured guard 54, and first apertured guard 50 and a second apertured guard 54.

The reactor 12 is chamber enclosed on all sides by a reactor wall 13. The reactor 12 is capable of accommodating a vacuum and may be capable of accommodating superatmospheric pressures.

The elements of CVD apparatus 10 are interrelated. The liquid precursor delivery pump 63 is in communication with the vaporizer 64 via the precursor liquid line 61. The pressure gauge 39 is in communication with the precursor liquid line 61. The carrier fluid line 67 is in communication with the vaporizer 64. The vaporizer 64 is in communication with the temperature regulated manifold 70 via the precursor vapor line 79. The oxygen line 71 communicates with the precursor vapor line 79; such communication may occur outside of the reactor 12. The reactor wall 13 may define some or all of the reactor 12.

Elements contained within the reactor 12 may include the temperature regulated manifold 70 and the substrate heater 14. The thermocouple 84 is used to monitor a temperature of the substrate heater 14. The thermocouple 83 is used to monitor a temperature of the temperature regulated manifold 70. The thermocouple 82 is used to monitor a temperature of the precursor vapor line 79 between the reactor wall 13 and the temperature regulated manifold 70. The vacuum pump 29 is in communication with the reactor 12 via the vacuum pump line 31. The thermocouple 81 is used to monitor a temperature of the precursor vapor line 79 between the vaporizer 64 and the oxygen line 71.

In operation, the CVD apparatus 10 is capable of the continuous deposition of the superconducting $YBa_2Cu_3O_{7-x}$ (YBCO) film onto a plurality of translating elongate substrates 25. The elongate substrates 25 may be multiple portions of at least one substrate or portions of multiple substrates or multiple portions of at least one substrate and portions of multiple substrates. The deposition may occur as follows: the liquid precursor delivery pump 63 delivers a solution stored at about room temperature containing the organometallic precursors tetramethyl heptanedionate, compounds of yttrium, barium, and copper, along with an appropriate mixture of solvents, such as tetrahydrofuran and isopropanol, to the vaporizer 64 via the precursor liquid line 61. The barium compound may be adducted with a compound such as phenanthroline to assure long-term stability. Upon introduction to the vaporizer 64, the solution is flash vaporized instantly, at approximately 240° C. An inert carrier gas, such as for example, argon, is introduced to the vaporizer 64 via the carrier fluid line 67, mixes with the organometallic precursor vapors, and delivers them toward the temperature regulated manifold 70 via the precursor vapor line 79. Alternatively, nitrogen may be substituted as the inert carrier gas. Oxygen is introduced via the oxygen line 71 to the inert carrier gas and organometallic precursor vapors mixture, and reacts. The point at which oxygen is introduced and the method of its introduction, described, facilitated the formation of a YBCO layer. A premature gas phase reaction may lead to undesired particle formation or condensation within the precursor vapor line 79 and the clogging of the temperature regulated manifold 70. The vapor-phase precursor composition is delivered to the reactor 12 via the precursor vapor line 79, and upon reaching the temperature regulated manifold 70, is injected substantially uniformly within the deposition zone, which may be defined by the dimensions of the substrate heater 14 and the temperature regulated manifold 70. As the elongate substrates 25 translate through the deposition zone, they are elevated in temperature by the substrate heater 14 to approximately 800° C. As the heated elongate substrates 25 communicate with the vapor-phase precursor composition, a thin film of YBCO is deposited thereon, as the by-products of the organics once linked to the yttrium, barium, and copper separate and are pumped away from the deposition zone. As there may be complicated gas dynamics involved with the deposition of YBCO onto the translating elongate substrates 25, it is desirable to focus any one of the radiant heat of the substrate heater 14, the vapor-phase precursor composition delivered by the temperature regulated manifold 70, and the radiant heat and the vapor-phase precursor composition. Further, as any reaction byproducts that linger about the deposition zone may tend to disrupt the deposition process, it may be desirable to remove any reaction byproducts from the deposition zone. Elements, such as for example, a first apertured guard 50 and second apertured guard 54, that accomplish these objectives may be included in the CVD apparatus 10 and are illustrated and discussed in FIG. 5*a* and FIG. 5*b*.

The deposition zone, which may be defined by the temperature regulated manifold 70 and the substrate heater 14, may be sized to enable the deposition onto as many as about 30 translating elongate substrates 25 simultaneously. Such translating elongate substrates 25 may be evenly spaced, such as, for example, being about two millimeters apart. The substrate heater 14 is positioned with respect to the temperature regulated manifold 70 at a distance (e.g., perhaps about 29 mm) so as to maintain the translating elongate substrates 25 at a temperature of approximately 800° C. throughout the length of the deposition zone, enabling the growth of a film of YBCO thereon. An unsuitable positioning of the substrate heater 14 with respect to the temperature regulated manifold 70 may result in the overheating of the temperature regulated manifold 70, or the condensation of vapors, forming a shower of particles as opposed to the growth of a thin film.

The precursor vapor line 79 may be surrounded by a heating coil or other type of thermal jacket that serves to maintain the organometallic precursor vapors and the carrier gas at a temperature of at least about 200° C. (condensation may occur at temperatures below about 200° C.). The temperature may be as great as 240° C. and higher. The oxygen line 71 may also be heated, although not necessarily at as high a temperature as the precursor vapor line 79. Additionally, the temperature regulated manifold 70 may include both a heating coil and a cooling coil. A heating coil is desirable during start up when it is necessary to maintain the temperature regulated manifold 70 at a temperature of about 240° C. while the substrate heater 14 is heating up. The cooling coil is desirable in that the temperature at which the substrate heater 14 operates, approximately 800° C., tends to elevate the temperature of the temperature regulated manifold 70. The temperature regulated manifold 70 is discussed with reference to FIGS. 6 and 7.

Figure 2A:
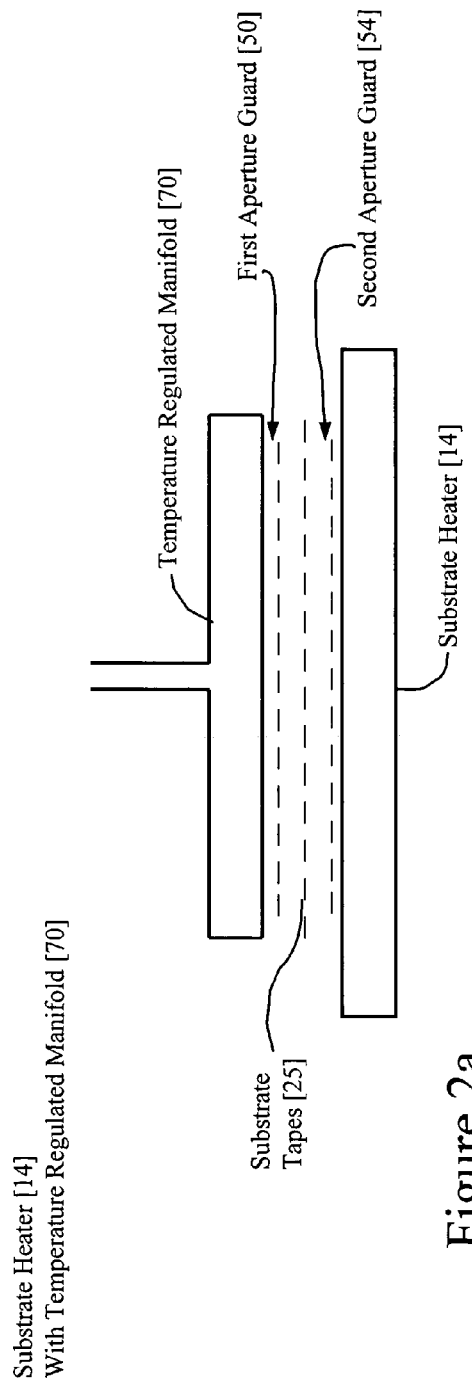
FIG. 2a is a schematic illustrating a front view of a temperature regulated manifold of a precursor injector, a first apertured guard, a second apertured guard, and a substrate heater usable in the CVD apparatus of FIG. 1.
Figure 2B:
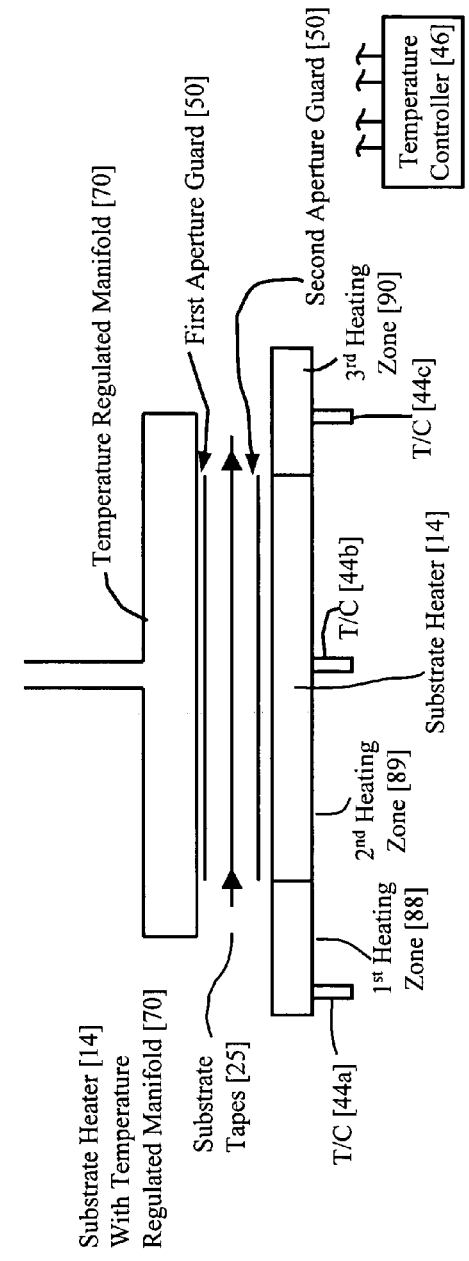
FIG. 2b is a schematic illustrating a side view of a temperature regulated manifold of a precursor injector, a first apertured guard, a second apertured guard, and a substrate heater usable in the CVD apparatus of FIG. 1.

FIG. 2a and FIG. 2b show front and side views, respectively, of the substrate heater 14 and the temperature regulated manifold 70. FIG. 2a shows a view of the substrate heater 14 and the temperature regulated manifold 70 as seen from the direction of translation of the elongate substrates 25, whereas FIG. 2b shows a view of the substrate heater 14 and the temperature regulated manifold 70 as seen from an orientation perpendicular to the direction of the translation of the elongate substrates 25. FIG. 2a and FIG. 2b show the temperature regulated manifold 70, the substrate heater 14, a plurality of elongate substrates 25, a first aperture guard 50, and a second aperture guard 54. FIG. 2b further shows a first heating zone 88, a thermocouple (T/C) 44a, a second heating zone 89, a T/C 44b, 75b, a third heating zone 90, a T/C 44c, and a controller 46.

The elongate substrates 25 may be a plurality of buffered metal substrate in excess of 100 meters in length, with widths between 3 mm and 1 cm. The elongate substrates 25 may be multiple portions of at least one substrate or portions of multiple substrates or multiple portions of at least one substrate and portions of multiple substrates.

The first aperture guard 50 is made using a material or combinations of materials that allow the unit to withstand the temperature of at least the deposition zone. Suitable materials include ceramics, high-temperature alloy, ceramic-coated metals, and the like. The first aperture guard 50 serves to shield the temperature regulated manifold 70 from the heat radiated by the substrate heater 14 and, further, to direct the precursor vapors ejected through the temperature regulated manifold 70 toward each of the plurality of translating elongate substrates 25.

The second aperture guard 54 is made using a material or combinations of materials that allow the unit to dissipate the heat radiated by the substrate heater 14 toward each of the plurality of translating elongate substrates 25. Suitable materials include ceramics, high-temperature alloy, ceramic-coated metals, and the like. The second aperture guard 54 also includes elements enabling the exhaust of undesirable reaction byproducts away from the elongate substrates 25, as described further in FIG. 5.

The first heating zone 88 of substrate heater 14 serves as a preheating zone to ramp up the temperature of the translating metal elongate substrates 25 to substantially the deposition temperature and to provide a desirably smooth temperature profile of the deposition zone created by the substrate heater 14.

The T/Cs 44a, 44b, and 44c are thermocouples that function to monitor and provide temperature measurements of each heating zone within the substrate heater 14 separately.

The controller 46 is comprised of temperature-controlling elements that control the temperature of each of the heating zones of the substrate heater 14 separately in response to the separately monitored temperatures of each zone.

The second heating zone 89 of the substrate heater 14 serves to radiantly heat the translating elongate substrates 25 to a deposition temperature of approximately 800° C. in such a way that the elongate substrates 25 are maintained at the deposition temperature over the entire deposition zone.

The final heating zone 90 of the substrate heater 14 serves to rapidly cool down the temperature of the elongate substrates 25 translating above.

The elements depicted in FIG. 2a and FIG. 2b are interrelated as follows: the substrate heater 14 is oriented substantially parallel to and below the temperature regulated manifold 70. The distant therebelow may be approximately 29 mm. The elongate substrates 25 translate between the substrate heater 14 and the temperature regulated manifold 70. The first aperture guard 50 is disposed between the temperature regulated manifold 70 and the elongate substrates 25. The second aperture guard 54 is disposed between the substrate heater 14 and the elongate substrates 25. The substrate heater 14 may include a plurality (such as for example, three) consecutive heating zones: the first heating zone 88, the second heating zone 89, and the final heating zone 90. The T/C 44a and the subcontroller 46 communicate with the first heating zone 88. The T/C 44b and the controller 46 communicate with the second heating zone 89. The T/C 44c and the controller 46 communicate with the final heating zone 90.

In operation, the elongate substrates 25 translate between the temperature regulated manifold 70 and the substrate heater 14. The plurality of elongate substrates 25 are initially exposed to heat provided by the first heating zone 88 of the substrate heater 14. The heat radiated by the first heating zone 88 of substrate heater 14 ramps up the temperature of the translating elongate substrates 25 to near the deposition temperature. Then, the elongate substrates 25 translate above the second heating zone 89 of the substrate heater 14. The temperature of the elongate substrates 25 is leveled out and maintained at approximately 800° C., which is the deposition temperature, as the elongate substrates 25 translate above the second heating zone 89 of the substrate heater 14. Deposition occurs onto the elongate substrates 25 as they translate above the second heating zone 89. Ultimately, the elongate substrates 25 next translate above the final heating zone 90 of the substrate heater 14, where their temperature is lowered. The heating zones of the substrate heater 14 enable the elongate substrates 25 to be maintained at substantially the deposition temperature throughout almost the entirety of the deposition zone. It is believed that a substantially uniform temperature profile in those portions of the substrate tape 25 within the deposition zone may not be achievable without using a multi-zone substrate heater 14.

A temperature monitor 44, such as for example, thermocouples 44a, 44b, and 44c, in communication with a controller or subcontroller 46, enables each zone of the substrate heater 14 to be individually monitored and controlled. The controller or subcontroller 46 may in turn communicate with a controller 22 for the coordinated operation of components of the CVD system 10. The independent control of the heating zones within the substrate heater 14 enables different temperature profiles to be obtained within the elongate substrates 25 during deposition runs.

The first aperture guard 50 may be used to shield the temperature regulated manifold 70 from heat radiated by the substrate heater 14. As a shield, first aperture guard 50 may assist with maintaining the temperature of the temperature regulated manifold 70. The second aperture guard 54 may be used to focus the radiative heat of the substrate heater 14 at the elongate substrates 25. Additionally, the second aperture guard 54 may be capable of removing reaction byproducts away from the deposition zone as further discussed in reference to FIG. 5.

As with FIG. 2a, FIG. 3 shows a cross sectional view of the substrate heater 14 and the temperature regulated manifold 70 as seen from the direction of translation of the elongate substrates 25. In addition to the temperature regulated manifold 70 and the substrate heater 14, FIG. 3 shows the first aperture guard 50, the elongate substrates 25, the second aperture guard 54. FIG. 3 includes details of the cross sectional view of the substrate heater 14 including an isolating housing 28, a refractory window 36, a cooling mechanism 38, a plurality of radiant heaters 18, and a substrate temperature monitor 30, such as, for example, a pyrometer 35 and a pyrometer optical path 33.

The isolating housing 28 is a structure that separates the components of the substrate heater 14 from the precursor gasses, their reaction products, and their reaction byproducts so as to prevent any adverse interactions. One benefit of such separation may be an extended operating time for the substrate heater 14 and, in turn, the CVD apparatus 10. To facilitate the separation while at the same time permitting the radiative heating by the substrate heater 14, a window that allows the communication of the radiant heaters 18 and the substrates 25 is included. An example of a window is a refractory window 36 that enables infrared radiation to be transmitted to the elongate substrates 25. A quartz window may be suitable for this purpose. The isolating housing 28 may be made using any materials that are capable of withstanding the precursor gasses, their reaction products, and their reaction byproducts and the deposition temperatures. Examples of such materials, without limitation, include high temperature alloys, ceramics, ceramic-coated alloys, ceramic composites, et cetera.

The cooling mechanism 38 may include a series of lines through which a coolant, such as, for example, water, may be pumped to cool the substrate heater 14. Further, the cooling mechanism 38 may be disposed of in such a way as to direct the radiant heat of the radiant heaters 18 at the elongate substrates 25.

The radiant heaters 18 are a heating source of the substrate heater 14. The radiant heaters 18 may be any heating source capable of providing radiant heat at a sufficient level so as to heat the elongate substrates 25 to a temperature that facilitates the deposition and/or growth of reaction products to form a coating from the precursor gasses. Examples of suitable radiant heaters 18 include lamps (e.g., halogen lamps), ceramics (e.g., boron nitride, silicon carbide, or molybdenum silicide (e.g., $MoSi_2$)) or high-temperature alloys (e.g., nickel chromium alloys). A number of these types of radiant heaters 18 are available form Kanthal Globar, Niagara Falls, N.Y.

The pyrometer 35 is a standard non-contact temperature-sensing device. The pyrometer optical path 33 may be a sapphire optical fiber that is transparent to infrared wavelengths. The pyrometer optical path 33 enables the pyrometer 35 to take measurements of the back side of the elongate substrates 25. It is desirable to use the pyrometer 35 to measure the temperature of the back sides of the elongate substrates 25 because the pyrometer 35 records temperature information by analyzing the infrared spectra emitted by hot objects and, thus, its analyses depend on the emissivity of the object. The emissivity of the deposition side of the elongate substrates 25 is constantly changing throughout the deposition process, but the emissivity of the rear side of the elongate substrates 25 remains substantially constant.

The elements of FIG. 3 are interrelated as follows: the substrate heater 14 is oriented substantially parallel with respect to the temperature regulated manifold 70. The substrate heater 14 may be about 29 mm below the temperature regulated manifold 70. The elongate substrates 25 translate between the temperature regulated manifold 70 and the substrate heater 14. The first aperture guard 50 is disposed between the temperature regulated manifold 70 and the elongate substrates 25. The second aperture guard 54 is disposed between the substrate heater 14 and the elongate substrates 25. The cooling mechanism 38 communicates with the isolating housing 28. The radiant heaters 18 are disposed within the isolating housing 28. The substrate temperature monitor 30 (e.g., a pyrometer 35) may be disposed without the isolating housing 28 or within the bottom side of the isolating housing 28. When the substrate temperature monitor 30 includes a pyrometer 35, an optical path 33, which may be disposed of through the isolating housing 28, may be included.

In operation, a deposition zone defined by the second heating zone 89 of the substrate heater 14 is designed to be approximately ten percent longer than the temperature regulated manifold 70, thereby ensuring that the precursor gasses that enter the deposition zone interact with the elongate substrates 25 at the deposition temperature. The radiant heaters 18 heat the elongate substrates 25 to the deposition temperature. A coolant is pumped through the cooling mechanism 38, thereby cooling the isolating housing 28 and, further, enabling heat to be dissipated from the substrate heater 14 toward the elongate substrates 25. The refractory window 36 is transparent to infrared radiation, while at the same time protecting the radiant heaters 18 from the precursor gasses, reaction products, and/or reaction byproducts of the deposition process occurring within the reactor 12. For example, the refractory window may avoid the formation of a coating from within the substrate heater 14 and/or on the radiant heaters 18.

As it is desirable that the CVD apparatus 10 operate continuously, in excess of about 10 hours at a time, it is desirable to monitor the radiant heaters 18 to enable their replacement upon failure. That is, either when one or more radiant heaters 18 fail completely or when one or more radiant heaters 18 do not provide sufficient power to heat the elongate substrates 25 to the deposition temperature, the one or more radiant heaters 18 are to be replaced. To that end, monitoring the current through each of the radiant heaters 18 provides one measure of their operational level. The current of any of the radiant heaters 18 dropping to zero is an indication of failure. A reduction in substrate temperature and a variation in current may likewise be an indication of failure. In either case, the radiant heaters 18 are replaced.

Obtaining the temperature of the elongate substrates 25 translating through the deposition zone is a challenge because the substrate tape is moving. The use of a pyrometer 35 with a CVD apparatus 10 allows non-contact temperature monitoring of the elongate substrates 25, thereby providing one type of substrate temperature monitor 30. Alternately, a dummy elongate substrate, which translates with the elongate substrates 25, in contact with a thermocouple may be used as an alternative substrate temperature monitor 30.

FIG. 4 shows certain components that may be included as part of the substrate heater 14 of FIG. 3. Such components include radiant heaters 18 (only one show), radiant heater supports 47a and 47b, terminals 43a and 43b, mechanical clips 45a and 45b, inert gas lines 94a and 94b, and a series of nozzles 92a and 92b.

The radiant heater supports 47a and 47b may be any material that is suitable for holding the radiant heaters 18 while at the same time not interfering with the radiant heaters' 18 operation and/or function. Such materials include refractory and/or refractory materials (e.g., ceramics, ceramic composites, and ceramic coated alloys).

The terminals 43a and 43b are elements through which current flows, and thereby supply power to one of the radiant heaters 18. The mechanical clips 45a and 45b are mechanical connections between the terminals 43a and 43b, respectively, and a set of power cables (not shown).

The inert gas lines 94a and 94b provide an inert gas, such as, for example, argon or nitrogen, via the nozzles 92a and 92b, respectively, to the terminals 43a and 43b of the radiant heaters 18.

The elements of FIG. 4 are interrelated as follows: the radiant heaters 18 are supported on either end by the radiant heater supports 47a and 47b. Each radiant heater 18 includes the terminals 43a and 43b at either end. The mechanical clips 45a and 45b serve as connections between the terminals 43a and 43b and a set of power cables (not shown). The inert gas line 94a, which includes the nozzles 92a, is disposed with respect to the radiant heater support 47a in such a way that the nozzles 92a are directed at the terminal 43a of each of the radiant heaters 18. The inert gas line 94b, which includes the nozzles 92b, is disposed with respect to the radiant heater support 47b in such a way that the nozzles 92b are directed at the terminal 43b of each of the radiant heaters 18.

In operation, the terminals 43a and 43b of the radiant heaters 18 are highly likely to fail during the extended manufacturing runs that characterize the operation of the CVD apparatus 10. Soldering or bracing of the terminals 43a and 43b to the cables that supply power to the radiant heaters 18 has been found to be unacceptable in achieving the extended manufacturing runs of CVD apparatus 10. The substrate heater 14 overcomes the challenge of terminal failure by including the mechanical clips 45a and 45b (two of which are shown for illustrative purposes) to serve as connections between the terminals 43a and 43b of the radiant heaters 18 and the cables that supply power. Such mechanical clips 45a and 45b may facilitate interchangeability. Additionally, by cooling to the terminals 43a and 43b, the failure of radiant heater 18 is reduce or eliminated. A substrate heater 14 including the features of FIG. 4 accomplishes terminal cooling by including the pair of inert gas lines 94a and 94b equipped with the series of nozzles 92a and 92b, respectively, disposed in such a manner as to direct an inert gas across the terminals 43a and 43b of each of the radiant heaters 18.

FIG. 5a and FIG. 5b show top and cross-sectional views, respectively, of the second aperture guard 54 of FIGS. 2a, 2b, and 3. The second aperture guard 54 may include a plurality of apertures 54a, 54b, and 54c communicating with an exhaust manifold 56 to capture reaction byproducts 53.

The apertures 54a, 54b, and 54c of the second aperture guard 54 may be adjustable in size. While three apertures 54a, 54b, and 54c are shown for illustrative purposes in FIG. 5a and FIG. 5b, the second aperture guard 54 is likely to include a number of the apertures 54 that may corresponds to the number of the elongate substrates 25 upon which deposition is occurring within the reactor 12.

The exhaust manifold 56 communicates with a pump capable of drawing the reaction byproducts 53 from the deposition zone. Examples of some reaction byproducts 53 include compounds such as organic byproducts, $CO_2$ and $H_2O$. It may be undesirable to have reaction byproducts 53 within the deposition zone as they interfere with the efficient transport of precursor gases to the elongate substrate 25.

The elements of FIG. 5a and FIG. 5b are interrelated as follows: the apertures 54a, 54b, and 54c are disposed on surfaces of the second aperture guard 54 in a manner that facilitates the capture of reaction byproducts 53 that, in turn, are communicated to the exhaust manifold 56 defined by second aperture guard 54. The reaction byproducts 53 captured by the apertures 54a, 54b, and 54c are directed through the exhaust manifold 56 using a pump, such as, for example, a vacuum pump.

Figure 6:
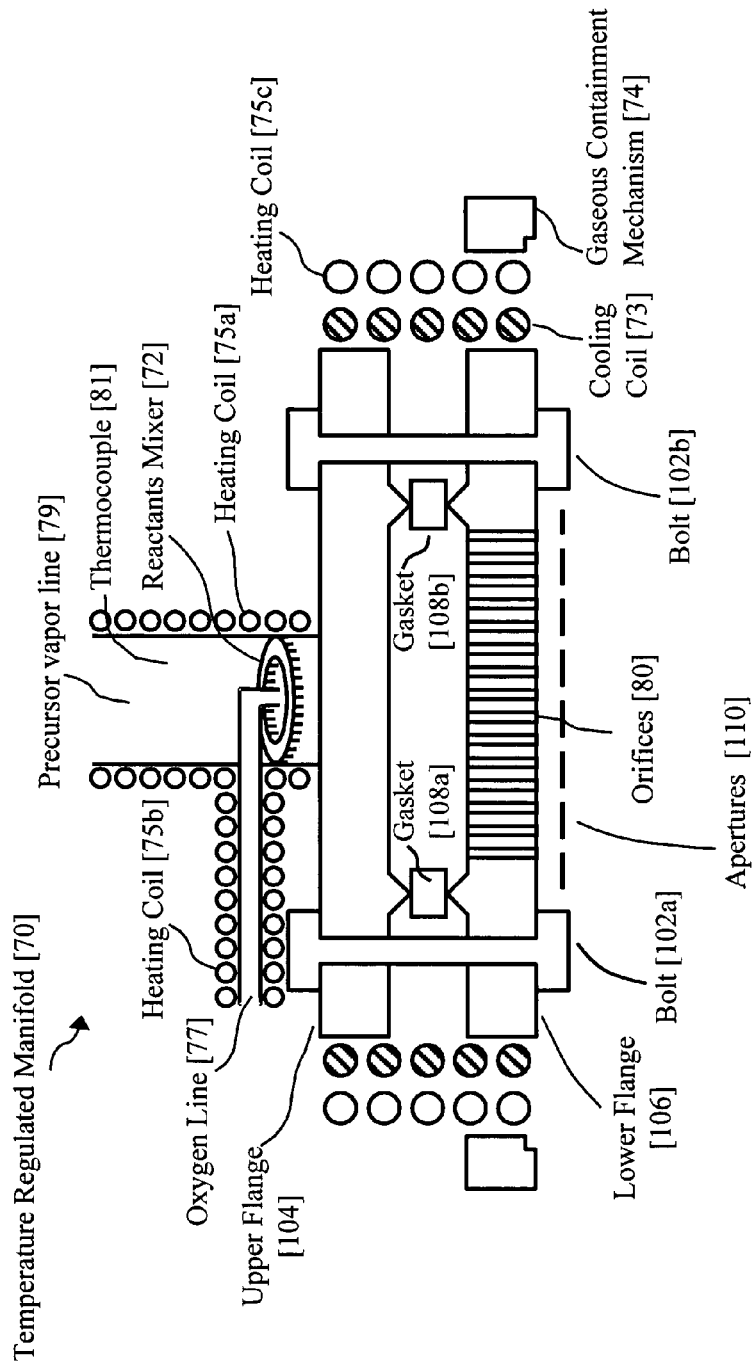
FIG. 6 is a schematic illustrating a cross sectional view of aspects of a temperature regulated manifold of a precursor injector usable in the CVD apparatus of FIG. 1.

FIG. 6 shows a cross-sectional view of a temperature regulated manifold 70 usable in the CVD apparatus 10 of FIG. 1. The temperature regulated manifold 70 may include a precursor vapor line 79, an oxygen line 77, an upper flange 104, a lower flange 106, fasteners 102a and 102b, gaskets 108a and 108b, a series of orifices 80, a heating coil 75a, a heating coil 75b, a cooling coil 73, a heating coil 75c, a precursor vapor containment mechanism 74, and a reactants mixer 72.

The upper flange 104 and the lower flange 106 are composed of a material, such as, for example, stainless steel, that when clamped together, form the sealed temperature regulated manifold 70. The material of upper flange 104 and the lower flange 106 is any material that is capable of withstanding the operating temperature of the temperature regulated manifold 70, while at the same time not interfering with its operation. The fasteners 102a and 102b are conventional, such as, for example, bolts that clamp the temperature regulated manifold 70 together. The gaskets 108a and 108b create a seal within the temperature regulated manifold 70 as the upper flange 104 and the lower flange 106 are clamped together via the fasteners 102a and 102b. The material of gaskets 108a and 108b is any material that is capable of withstanding the operating temperature of the temperature regulated manifold 70, while at the same time providing the seal and not interfering with the temperature regulated manifold's 70 operation.

The orifices 80 of the temperature regulated manifold 70 may be a series of numerous fine openings of between about 20 and about 30 mils in diameter through which the precursor gasses are delivered to the reactor 12. The total cross-sectional area of the orifices 80 may be less than the cross-sectional area of the precursor vapor line 79 to achieve a desirable pressure head. The lengths of the orifices 80 through the lower flange 106 may be between about 5 and about 10 millimeters.

The heating coil 75a may be a conventional heating coil or heating jacket disposed about the precursor vapor line 79. The heating coil 75b may be a conventional heating coil or heating jacket disposed about the oxygen line 77. The cooling coil 73 may be a conventional cooling coil or cooling jacket disposed about the temperature regulated manifold 70 between the top of the upper flange 104 and the bottom of the lower flange 106. The heating coil 75c may be a conventional heating coil or heating jacket disposed about the temperature regulated manifold 70 between the top of the upper flange 104 and the bottom of the lower flange 106.

The gaseous containment mechanism 74 is an outlet that spans the perimeter of the temperature regulated manifold 70 and directs a blanket of inert gas, such as, for example, argon or nitrogen, around the deposition zone.

The reactants mixer 72 is an injector that is designed to optimally and uniformly mix the oxygen delivered via the oxygen line 77 with the precursor vapors flowing through the precursor vapor line 79.

The elements of FIG. 6 are interrelated as follows: the upper flange 104 and the lower flange 106 are clamped together with the fasteners 102a and 102b to form the temperature regulated manifold 70. A seal is formed within the temperature regulated manifold 70 by the gaskets 108a and 108b. The orifices 80 are disposed within the lower flange 106. The gaseous containment mechanism 74 is disposed around the perimeter of the temperature regulated manifold 70. The precursor vapor line 79 delivers precursor vapors into the temperature regulated manifold 70. The oxygen line 77 is in communication with the precursor vapor line 79 at a point close to the temperature regulated manifold 70. The reactants mixer 72 is disposed at the end of the oxygen line 77 within the precursor vapor line 79. The heating coil 75a is disposed around the precursor vapor line 79. The heating coil 75b is disposed around the oxygen line 77. The cooling coil 73 is disposed around the temperature regulated manifold 70 between the top of the upper flange 104 and the bottom of the lower flange 106. The heating coil 75c is disposed around the temperature regulated manifold 70 between the top of the upper flange 104 and the bottom of the lower flange 106.

The temperature regulated manifold 70 is disposed within the reactor 12 in a manner that keep the distance between the vaporizer 64 and the temperature regulated manifold 70 appropriate. Dimensions of the temperature regulated manifold 70 depend upon the desired length of the deposition zone. For example, the dimensions for the temperature regulated manifold 70 may start at about 50 cm in length and about 20 cm in width.

In operation and prior to film deposition while the substrate heater 14 coming to the operating temperature, the apertures 55 are closed and the heating coil 75c maintains the temperature regulated manifold 70 at a temperature of about 240° C. During deposition, the apertures 55 are open and direct the flow of precursor vapors in toward the translating elongate substrate 25. While the apertures 55 are open, the cooling coil 73 prevents the temperature regulated manifold 70 and the precursor vapors therein from overheating due to the heat radiated by the substrate heater 14. The oxygen line 77 is heated by a heating coil 75b to a point above room temperature, such as, for example, about 240° C. The oxygen is introduced to the precursor vapors, which are traveling through the precursor vapor line 79 from the vaporizer 64 to the temperature regulated manifold 70, uniformly at a point close to the temperature regulated manifold 70 in such a manner as to be dispersed evenly throughout the precursor vapors. The reactants mixer 72, which may be a ring with small holes, serves to achieve mixing and flow. If oxygen is improperly introduced, film growth is not uniform over the deposition zone. The heating coil 75a maintains the entire precursor vapor line 79 at a temperature between 75c and 270° C., thereby eliminating the possibility of condensation occurring within the precursor vapor line 79 or clogging of the orifices 80.

The gaseous containment mechanism 74 issues a blanket of inert gas, such as, for example, argon or nitrogen gas from around the perimeter of the temperature regulated manifold 70 to serve as an inert barrier forcing the flow of precursor vapors, which tend to diverge upon their issuance from the orifices 80, to a directed flow toward the portions of the elongate substrates 25 within the deposition zone.

Figure 7:
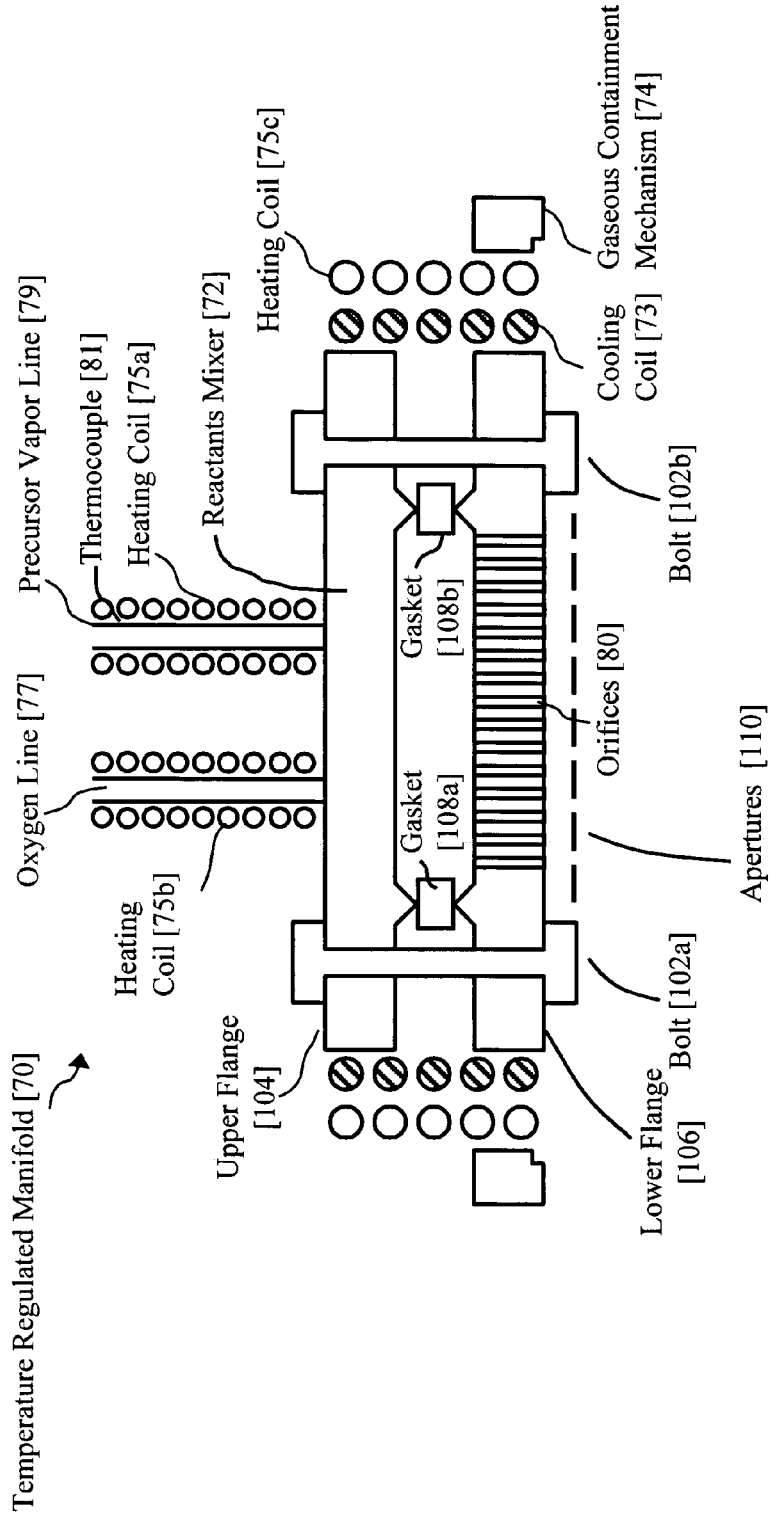
FIG. 7 is a schematic illustrating a cross sectional view of aspects of an alternative temperature regulated manifold of a precursor injector usable in the CVD apparatus of FIG. 1.

FIG. 7 shows a cross-sectional view of an alternative temperature regulated manifold 70 to that shown in FIG. 6. The temperature regulated manifold 70 of FIG. 7 includes the upper flange 104, the lower flange 106, the fasteners 102a and 102b, the gaskets 108a and 108b, the orifices 80, the gaseous containment mechanism 74, the heating coil 75c, and the cooling coil 73, all described in respect to FIG. 6. The temperature regulated manifold 70 of FIG. 7 also includes a precursor vapor line 79, an oxygen line 77, a heating coil 75a, and a heating coil 75b.

The precursor vapor line 79 provides precursor vapors from the vaporizer 64 to the temperature regulated manifold 70. The oxygen line 77 provides oxygen to the temperature regulated manifold 70.

The heating coil 75a is a conventional heating jacket or coil affixed, such as, for example, by welding, about the precursor vapor line 79. The heating coil 75b is a conventional heating jacket or coil affixed, such as, for example, by welding, about the oxygen line 77.

The elements of FIG. 7 are interrelated as follows: the upper flange 104 and the lower flange 106 are clamped together with the bolts 102a and 102b to form the temperature regulated manifold 70. A seal is formed within the temperature regulated manifold 70 by the gaskets 108a and 108b. The orifices 80 are disposed within the lower flange 106. The gaseous containment mechanism 74 is disposed around the circumference of the temperature regulated manifold 70. The precursor vapor line 79 delivers precursor vapors into the temperature regulated manifold 70. The oxygen line 77 delivers oxygen into the temperature regulated manifold 70. The heating coil 75a is disposed around the precursor vapor line 79. The heating coil 75b is disposed around the oxygen line 77. The cooling coil 73 is disposed around the temperature regulated manifold 70 between the top of the upper flange 104 and the bottom of the lower flange 106. The heating coil 75c is disposed around the temperature regulated manifold 70 between the top of the upper flange 104 and the bottom of the lower flange 106.

In operation, the temperature regulated manifold 70 of FIG. 7 functions similarly to the temperature regulated manifold 70 of FIG. 6, with the exception that oxygen is introduced to the precursor vapors within the temperature regulated manifold 70, as opposed to prior to entering the temperature regulated manifold 70. The introduction of oxygen directly into the temperature regulated manifold 70 prevents premature interaction of the gases, enabling a more efficient utilization of the costly precursors. When oxygen is ejected into the flow of precursor vapors traveling from the vaporizer 64 to the temperature regulated manifold 70, as shown in FIG. 6, a less efficient utilization of the precursors may be realized, and up to twenty percent of the precursor vapor may react with the oxygen prematurely.

Returning to FIG. 1 and as the CVD apparatus 10 is usable in the manufacture of superconducting conductors, it includes a substrate translation mechanism 26 such as a tape handler. Examples of usable substrate translation mechanisms 26 include at least one of a conveyor, a reel-to-reel unit, a robotic translator, and combinations thereof.

A conventional stepper or AC vector drive motor may be used to drive the payout spool and take-up spool of the tape handler. In other applications, AC motors (synchronous or variable frequency) or DC motors (brushed, brushless serve) and drives may be used. The motor is selected to be capable of providing the required translation speed of the elongate substrate 25. Also, the motor may have the ability to move the elongate substrate 25 in user-specified increments and to reverse the direction of the elongate substrate 25. The take-up spool and the payout spool each may be driven by a conventional torque motor that assists in providing the proper tension to the elongate substrate 25 as it translates through the CVD apparatus 10.

A shown in FIG. 1, at least one controller 22 may be part of the CVD apparatus 10, for example, to coordinate the operation of its various parts, components, and peripherals. The controller 22 of FIG. 1 may be in communication a plurality of valves, the zone of the substrate heater 14, the precursor source 60, an exhaust system, a gas supply, the temperature regulated manifold 70, auxiliary heaters, one or more mass flow regulators, and the translation mechanism 26.

The controller 22 is a commercially available controller with a plurality of inputs and outputs that meet the requirements of the peripherals. The controller 22 may be a micro-controller or a PC with appropriate hardware and software. Details concerning controllers that may be used with the CVD apparatus 10 are discussed in, for example, U.S. Pat. Nos. 5,980,078; 5,726,912; 5,689,415; 5,579,218; 5,351,200; 4,916,600; 4,646,223; 4,344,127; and 4,396,976, the entire disclosure of each being incorporated by reference herein.

Further, to facilitate the operation of the CVD apparatus 10, its various parts, components, and peripherals, at least one sensor is in communication with the at least one controller 22. Examples of the at least one sensor include any one of a flow meter, a species monitor, a deposition sensor, a temperature sensor, a pressure sensor, a vacuum sensor, a speed monitor, and combinations thereof. Some specific examples of use of the at least one controller include regulating: the precursor source 60, at least one temperature regulated manifold 70, a translational speed of the elongate substrate 25, and combinations thereof Examples of elongate substrates that may be inspected in a CVD apparatus 10 of the present invention include, without limitation, a substrate such as any of those disclosed in U.S. Pat. Nos.: 6,610,632; 6,541,121; 6,383,989; and 5,872,080; U.S. Pat. Nos.: 6,610,414; 6,610,413; 6,607,839; 6,607,838; 6,602,313; 6,599,346; 6,451,450; 6,447,714; 6,331,199; 6,156,376; 6,106,615; 5,964,966; 5,958,599; 5,898,020; 5,741,377; and 5,739,086; and U.S. Pat. Nos.: 6,562,761; 6,475,311; 6,458,223; 6,426,320; 6,027,564; and 6,022,832 (the disclosure of each being hereby incorporated by reference in their entirety). For the manufacture of an HTS conductor, the elongate substrate 25 is formed of metals, such as stainless steel or a nickel alloy such as HASTELLOY® or INCONEL®, that are capable of withstanding high temperatures and vacuum conditions. The elongate substrate 25 is typically between about 3 to about 60 millimeters (mm) in width and upwards of several hundred meters in length. Applicant contemplates that the elongate substrate 25 may be any width between about 1 mm and 100 mm. After processing, an elongate substrate 25 may be sliced into a plurality if tapes having lesser widths. For example, an about 60 mm wide, processed elongate substrate 25 may be sliced in a manner that produces four about 15 mm wide tapes. In a like manner, an about 12 mm wide processed tape may be sliced in a manner that produces four about 3 mm wide tapes. Thus, Applicants contemplate that the elongate substrate 25 may include any width between 1 and 100 mm, such as for example 4 mm, 5 mm, 10 mm, 11 mm, 12 mm, 98 mm, and 99 mm. The elongate substrate 25 typically has several meters of "leader" at both ends to aid in handling.

In operation of CVD apparatus 10, a user first activates the translation of the elongate substrate 25 by the tape translation mechanism 26.

Those skilled in the art will appreciate that the morphology of the deposited HTS film may change as a function of several variables, such as but not limited to:

Deposition temperature: HTS film surface roughness is affected by the deposition temperature;

Precursor composition: for example, the molarity (concentration) of the precursor affects the morphology of the film, e.g., a barium-deficient film has a morphology that differs from a barium-rich film as well as a stoichiometric film;

Precursor delivery rate: for example, the first layer deposited is continuously exposed to a high temperature as it translates through the deposition zone 118, which may cause damage to the morphology of this first layer in the time it takes to translate through the entire deposition zone 118. Increasing the precursor delivery rate for subsequent layers will shorten the time that the first layer experiences this high heat and may thereby minimize potential damage.

Oxygen partial pressure: It is necessary to prepare the film under a different oxygen partial pressure and substrate temperature. For example, where the precursor delivery rate is increased twice from 0.25 to 0.5 ml/min, good performance is obtained when 0.5 Torr higher oxygen partial pressure is used. Oxygen partial pressure should be increased in accordance with the above example when the substrate temperature is increased. Oxygen partial pressure can be determined empirically depending on processing parameter changes, such as the distance between the temperature regulated manifold 70 and the elongate substrate 25, the exposure of UV light to source vapor, or the use of atomic oxygen or ozone as an oxidant.

Specific analysis of some of the variables affecting the morphology of the HTS film is provided below.

It has been demonstrated that, assuming a delivery rate of about 0.25 mL/min and a deposition temperature of about 800° C., an increase in the precursor molarity (i.e., the number of moles of solute per liter of solution) of the precursor results in an increase in film thickness for a deposition time of 20 minutes. For example:

a molarity of about 0.03 mol/L yields a film thickness of about 1.0 micron;

a molarity of about 0.045 mol/L yields a film thickness of about 1.3 microns; and a molarity of about 0.06 mol/L yields a film thickness of about 1.75 microns. It has been demonstrated that, assuming a precursor molarity of about 0.03 mol/L and a deposition temperature of about 800° C., an increase in the precursor delivery rate also results in an increase in film thickness. For example:

a delivery rate of about 0.25 mL/min yields a film thickness of about 1.0 micron;

a delivery rate of about 0.5 mL/min yields a film thickness of approximately about 2.0 microns; and a delivery rate of about 1 mL/min yields a film thickness of approximately about 4.0 microns.

It has been demonstrated that, assuming a deposition temperature of about 800° C., varying the combination of the precursor delivery rate, the precursor molarity, and the oxygen partial pressure affects the critical current (Jc) value of the resulting film. For example:

EXAMPLE 1

A delivery rate of 0.25 mL/min, combined with a molarity of about 0.03 mol/L, combined with an oxygen partial pressure of about 0.56 Torr yields a critical current of about 2.7 MA/cm$^2$ for an about 0.6 micron thick film (Example 1);

EXAMPLE 2

A delivery rate of about 0.50 mL/min, combined with a molarity of about 0.03 mol/L, combined with an oxygen partial pressure of about 0.56 Torr yields a critical current of about 0 A/cm² for an about 0.6 micron thick film (the same thickness of film was obtained even though the deposition time was reduced to half that of Example 1);

EXAMPLE 3

A delivery rate of about 0.5 mL/min, combined with a molarity of about 0.03 mol/L, combined with an oxygen partial pressure of about 1.08 Torr yields a critical current of about 2.5 MA/cm² for an about 0.6 micron thick film (the same thickness of film was obtained, even though the deposition time was reduced to half that of Example 1); and

EXAMPLE 4

A delivery rate of about 0.5 mL/min, combined with a molarity of about 0.06 mol/L, combined with an oxygen partial pressure of about 1.08 Torr yields a critical current of about 2.2 MA/cm² for an about 0.6 micron thick film (the same thickness of film was obtained even though the deposition time was reduced to half that of Example 3).

Furthermore, precursor vapors and their inert carrier gas are efficiently delivered to the deposition zone within a temperature range of between about 230 and 300° C.

Lastly, the temperature of the elongate substrate 25 during the deposition process may affect the end properties. For example, high critical current (Jc) of about 35 A was obtained for the film with a thickness of about 0.35 microns that was prepared at about 800° C. (Jc=1 MA/cm²). However, for a film having the same thickness but prepared at about 810° C. the Jc dropped to about 10 A.

Using the example of FIG. 1, parameters, including those outlined above, that may affecting the film deposition process within CVD apparatus 10 are given in Table 1 below.

TABLE 1

Parameters regarding CVD apparatus 10

|  | Acceptable examples or acceptable range | Narrower acceptable examples or acceptable range |
|---|---|---|
| Liquid organometallic precursor solution within the precursor supply system 16 | THD compounds of Y, Ba, and Cu with a molar ratio of Y: about 1 Ba: between about 1.8 & 2.6 Cu: between about 2.5 & 3.5, with solvents, such as tetrahydrofuran and isopropanol. Alternately, THD compounds of Sm (or Nd, Eu), Ba, and Cu with a molar ratio of Sm (or Nd, Eu): about 1 Ba: between about 1.8 & 2.6 Cu: between about 2.5 & 3.5. Alternately, part of Y is substituted with Sm (or Nd, Eu) up to 50%. | THD compounds of Y, Ba, and Cu with a molar ratio of Y: about 1 Ba: between about 1.9 & 2.5 Cu: between about 2.8 & 3.2, with solvents, such as tetrahydrofuran and isopropanol. Alternately, THD compounds of Sm(or Nd, Eu), Ba, and Cu with a molar ratio of Sm(or Nd, Eu): about 1 Ba: between about 1.9 & 2.5 Cu: between about 2.8 & 3.2. Alternately, part of Y is substituted with Sm (or Nd, Eu) up to 50%. |
| Molarity of the precursor solution within precursor supply system 16 | Between about 0.015 & 0.070 mol/L | Between about 0.050 & 0.070 mol/L |
| Temperature of the liquid precursor solution within precursor supply system 16 | Between about 200 & 300° C. | Between about 250 & 270° C. |
| Liquid flow rate via precursor supply system 16 | Between about 0.1 and 10 mL/min | Between about 0.5 & 5 mL/min |
| Flash vaporization temperature within vaporizer 64 | Between about 200 & 300° C. | Between about 250 & 270° C. |
| Inert gas pressure | Between about 16 & 30 psi | Between about 16 & 20 psi |
| Partial oxygen | Between about 0.4 & 5 Torr | Between about 0.5 & 3 Torr |
| Vapor precursor temperature via the precursor vapor line 48 | Between about 200 & 300° C. | Between about 250 & 270° C. |
| Length of temperature regulated manifold 70 | Between about 10 & 30 cm | Between about 15 & 20 cm |
| The substrate tape 18 temperature via heating with substrate heater 14 | Between about 700 & 950° C. | Between about 750 & 820° C. |
| The substrate tape 18 translation rate | Between about 0.25 & 40 cm/min | Between about 1 & 40 cm/min |
| Resulting HTS film thickness | Between about 0.5 & 10 microns | Between about 3 & 10 microns |

Figure 8:
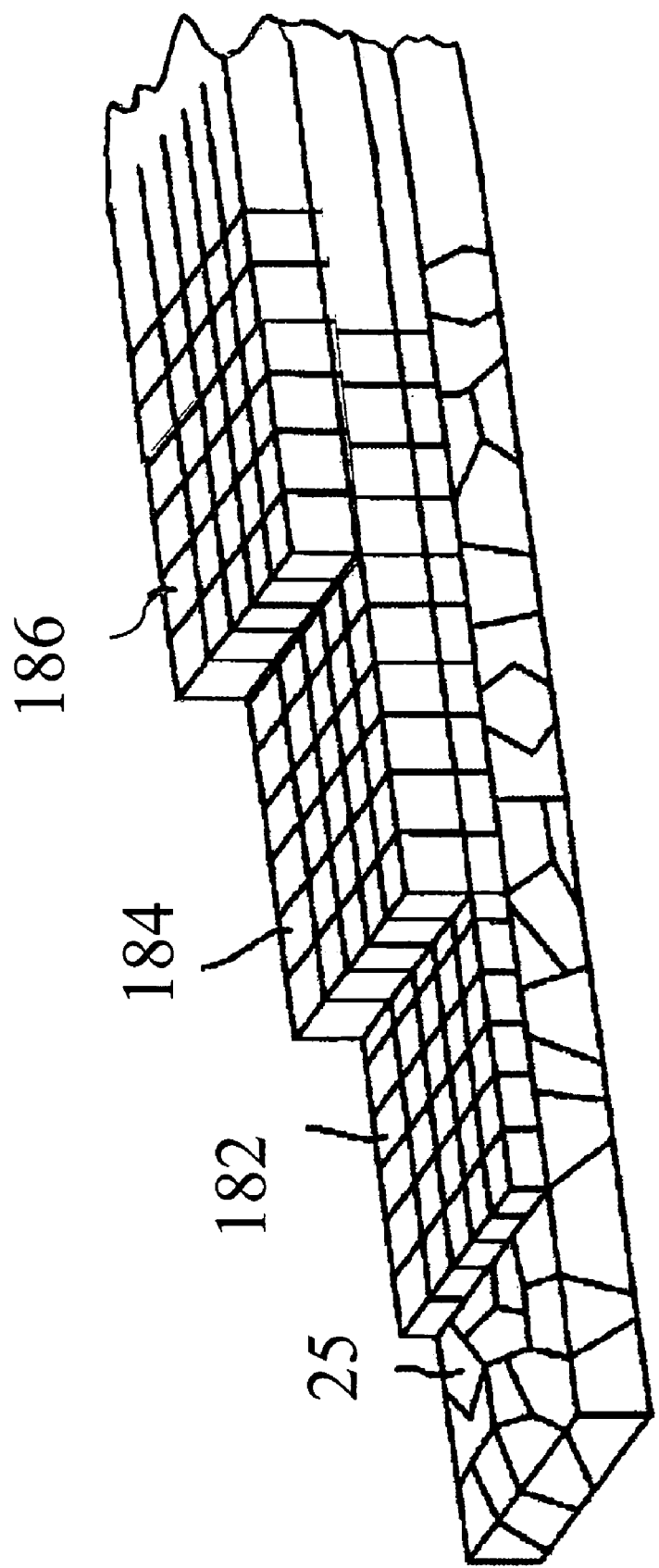
FIG. 8 is a schematic illustrating cutaway view of an example of a HTS conductor, a portion of which may be formed using the CVD apparatus of FIG. 1.

The detailed operation of the CVD apparatus 10 is described using an example HTS-coated tape as shown in FIG. 8.

FIG. 8 illustrates a cutaway view of an example HTS conductor 80 formed via the CVD apparatus 10 of FIG. 1. The HTS conductor 80 includes an elongate substrate 25, such as a metallic material. Suitable metallic materials include, but are not limited to, steel, nickel, nickel alloys, and alloys of copper, iron, and molybdenum. The elongate substrate 25 may be lattice-matched to the oxide superconductor, such as by the deformation texturing of the elongate substrate 25. Alternatively, the elongate substrate 25 is coated with a buffer layer 182 that contains some degree of crystallographic alignment and which is reasonably lattice-matched with the oxide superconductor. The buffer layer 182 has an epitaxial oxide superconductor layer 184 deposited thereon. Suitable compositions for the buffer layer 182 include but are not limited to, zirconia, YSZ, LaAlO$_3$, SrTiO$_3$, CeO$_2$, and MgO, preferably ion-beam assisted deposition (IBAD) YSZ, LaAlO$_3$, SrTiO$_3$, CeO$_2$, and MgO. For example, the elongate substrate 25 may be a flexible length of substrate formed from a variety of metals, such as stainless steel or a nickel alloy such as HASTELLOY® or INCONEL®, upon which buffer layers, such as yttria-stabilized zirconia (YSZ) and/or cerium oxide (CeO$_2$) have been previously deposited with a bi-axial texture, for instance, a (100)<001> cube texture. The oxide superconductor layer 184 desirably has a thickness in the range of greater than or equal to about 0.5 microns (μm), preferably greater than or equal to 0.8 microns (μm) and most preferably greater than or equal to 1.0 microns (μm). When the elongate substrate 18 is lattice-matched to the oxide superconductor, the superconductor layer 184 is deposited as one or more layers to the desired thickness on the elongate substrate 25 to form an HTS film, such as YBCO, via the CVD apparatus 10 of FIG. 1. Alternatively, when the elongate substrate 25 is coated with a buffer layer 182 that contains some degree of crystallographic alignment that is reasonably lattice-matched with the oxide superconductor, the superconductor layer 184 is deposited as one or more layers to the desired thickness on the buffer layer 182 to form an HTS film. Finally, the superconductor layer may be covered by a noble metal layer 186.

With reference to FIGS. 1, 2a, 2b, 3, 4, 5a, 5b, 6, and 7 the operation of the CVD apparatus 10 of the present invention is as follows:

Sufficient vacuum is developed within the reactor 12 by activating the exhaust system 20. The linear translation of the elongate substrate 25 through the deposition zone begins in a direction progressing from left to right. (The mechanisms for translating the elongate substrate 25 are tape translation mechanism 26.) All heating elements within the substrate heater 14 are activated to provide the desired temperature to the elongate substrate 25 according to Table 1.

The precursor source 60 contains a liquid organometallic precursor solution according to Table 1. The pump 63 is activated to feed the liquid precursor from the precursor source 60 into the vaporizer 64. There, the solution is flash vaporized and then mixed with a carrier fluid, such as argon or nitrogen, feeding into the vaporizer 64 from the carrier fluid supply 66 to form a superconductor (e.g., yttrium-barium-copper-oxide (YBa$_2$Cu$_3$O$_7$ or "Y123") or samarium-barium-copper-oxide (SmBa$_2$Cu$_3$O$_7$ or "Sm123") precursor vapor. The superconductor precursor vapor from vaporizer 64 is then carried to the reactor 12 through a line via a delivery column 48 to the temperature regulated manifold 70. The line, delivery column 48, and temperature regulated manifold 70 are maintained at an appropriate temperature, according to Table 1, via heating coils (not shown). Additionally, oxygen is introduced to the line just prior to the superconductor precursor vapor entering the reactor 12 via an oxygen line coming from mass flow regulator 50.

Having activated the deposition process within the reactor 12 of the CVD apparatus 10, and having set all control parameters according to Table 1, the HTS conductor 80 is formed as follows:

A line delivers the superconductor precursor vapor to the delivery column 48 of the temperature regulated manifold 70 that uniformly directs this vapor precursor toward the elongate substrate 25 within the deposition zone. The result of the oxygen reacting with the superconductor precursor vapor, and then this reacting combination coming into contact with the hot elongate substrate 25 within the deposition zone, causes the superconductor precursor to decompose and form a layer of superconductor atop the elongate substrate 25 as it translates through the deposition zone. The defects within the layer are minimized via the control parameters according to Table 1.

Thus, the layer provides a high quality template for growing additional superconductor material or material such as silver or copper, which can be deposited by any film deposition method. As a result, the superconductor layer or, collectively, the superconductor layers or HTS layers corresponding to any alternate precursor used that form the HTS conductor 80 have a thickness of greater than about 2 microns with a critical current density of approximately greater than about 1 MA/cm$^2$.

As a result, the CVD apparatus 10 of the present invention is capable of producing a YBCO film or HTS corresponding to any alternate precursor used with a thickness in excess of about 1.5 microns that has increased material density and smoothness that results in increased current capacity of over at least about 150 A/cm width.

In an alternative embodiment, precursor may be delivered to multiple deposition zones of a CVD apparatus 10 by a multi-compartment temperature regulated manifold 70 to supply the precursor to the elongate substrate 25 as a single unit. Alternatively, the precursor may instead be delivered to multiple deposition zones of a CVD apparatus 10 by a multiple temperature regulated manifold 70. Each compartment of a multi-compartment temperature regulated manifold 70 or separately installed precursor injectors 24 could have an associated separate heater for supplying heat to the elongate substrate 25.

In another alternative embodiment, multiple precursors may be delivered to the deposition zone of the CVD apparatus 10 by separately installed precursor injectors 24 to supply the separate precursors to the elongate substrate 25 instead of using multi-compartment precursor injectors 24 designed as a single unit. Each separately installed temperature regulated manifold 70 would have an associated separate heater for supplying heat to the elongate substrate 25.

The CVD apparatus 10 includes a precursor supply system 16. As shown in FIG. 1, the precursor supply system 16 comprises a precursor source 60 that is a reservoir formed of, for example, a metal or plastic vessel that contains a solution containing organometallic precursors, such as yttrium, barium, and copper, along with an appropriate mixture of solvents. The precursor source 60 feeds a delivery mechanism 42 such as for example, a pump, capable of a low flow rate between 0.1 and 10 mL/min. An example of a delivery mechanism 42 is a high-pressure, low flow rate pump, such as a high-pressure liquid chromatography (HPLC) pump. The delivery mechanism 42 feeds a vaporizer 64 that includes elements with which a precursor solution may be flash vaporized and mixed with an inert carrier gas, such as argon or nitrogen, for delivery to the temperature regulated manifold 70. The vaporized precursors exit the vaporizer. Just prior to the line entering the reactor 12, an oxygen line opens into the vapor line. The oxygen line is a tube or pipe through which oxygen passes for introduction to the precursor vapors and their inert carrier gas flowing within the precursor vapor line. Each instantiation of the precursor vapor line enters the reactor 12 ready for delivery through the temperature regulated manifold 70 onto a elongate substrate 25.

The CVD apparatus 10 includes an exhaust system 20 connected to the reactor 12. The exhaust system 20 is a commercially available vacuum pump capable of maintaining a vacuum of pressure in the order of magnitude of $10^{-3}$ Torr, such as a Leybold model D65B. Alternatively, the function of the exhaust system 20 may be accomplished by a combination of a mechanical pump and a mechanical booster, such as Edwards model EH500, in order to obtain the proper vacuum suitable for use with a large amount of liquid precursor.

The precursor supply system 16 and the exhaust system 20 are shown as being located external to the reactor 12. Additionally, those skilled in the art will appreciate that the CVD apparatus 10 further includes various sensing and control devices, such as pressure gauges and thermocouples, which are, for simplicity, not shown in FIGS. 1 and 2.

Samarium and yttrium belong to the same group within the periodic table of elements, which means that the samarium-barium-copper precursor behaves in a very similar manner to the yttrium-barium-copper containing precursor. As a result, the samarium-barium-copper superconducting compound may be deposited with similar deposition conditions as the yttrium-barium-copper superconducting compound. Such processing conditions include the temperature of the vapor lines between about 250 and 300° C., the elongate substrate 25 temperature of between about 700 and 950° C., the deposition pressure of between about 1 and 10 Torr, the oxygen partial pressure of between about 0.5 to 5 Torr, and the liquid precursor delivery rate of between about 0.25 and 10 mL/min. Since the yttrium-barium-copper precursor and the samarium-barium-copper precursor have similar properties, the heating or cooling requirements of the elements within the CVD apparatus 10 need no special design to accommodate the different materials.

In general, the thickness of each layer being deposited is determined by the combination of three factors: (1) the physical length, (2) precursor vapor delivery rate, and (3) its associated precursor molarity (i.e., concentration of the precursor solution). Additionally, the thickness of each film is directly proportional to each of these three factors. For example, the longer the physical length of its associated compartment, the thicker the film; the higher the associated vapor precursor delivery rate, the thicker the film; and the more concentrated the associated precursor solution, the thicker the film.

As one example of these controls, the thickness of the layer 184 may be determined by the combination of the physical length of the heater 14 within the temperature regulated manifold 70, the delivery rate of the samarium-barium-copper containing precursor, and the concentration of the samarium-barium-copper containing liquid precursor.

In the case of the YBCO single layer, research indicates that the critical current density reaches a maximum and levels off at around about 1.5 microns because, as the film thickens, the surface roughness progressively increases, making a progressively poorer and poorer template for crystal growth and causing misaligned crystals, thereby inhibiting any increase in current flow. Additionally, the film becomes more porous as the film thickens, thereby inhibiting any increase in current flow.

By contrast, the Sm123 is a smoother film than YBCO. Thus, growing Sm123 atop a layer of YBCO reduces the surface roughness and makes a better template for growing any additional YBCO layers. The YBCO-Sm123 sequence may be repeated without limiting or inhibiting the flow of current; by contrast, a single thick layer of YBCO shows no more increase of current flow beyond a thickness of about 1.5 microns. Sm123 and YBCO are both superconducting materials with similar properties, so diffusion between layers should not pose a significant problem. See e.g., U.S. patent application Publication Nos.: US 2001/0056041, "Architecture for high critical current superconducting tapes," Dec. 27, 2001; and US 2003/0036483, "High temperature superconducting thick films," Feb. 20, 2003 as well as U.S. Pat. No.: 6,541,136, "Superconducting structure," Apr. 1, 2003 (the disclosure of each being hereby incorporated by reference in their entirety).

The formation of a multi-layer HTS-coated tape using the CVD apparatus 10 is not limited to YBCO with Sm123; other superconducting materials may be used. For example, other oxides that are chemically compatible to YBCO, such as RE123 (where RE=rare earth metals such as neodymium (Nd), europium (Eu), lanthanum (La), holmium (Ho), Gadolinium (Gd)), may be used. Additionally, an HTS-coated tape formed using the CVD apparatus 10 is not limited to any specific number of layers. The temperature regulated manifold 70 may be expanded to any number of compartments, as long as precursor delivery lines and pumps are sized to handle delivery to multiple zones at the proper delivery rate. Furthermore, the substrate heater 14 may be expanded to any length accordingly. Alternatively, there may be separate heater zones within the substrate heater 14 that directly correspond to the compartments and resulting deposition zones for further temperature control if needed.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

It should be understood that all such modifications and improvements have been deleted herein for the sake of conciseness and readability but are properly within the scope of the following claims.

The invention claimed is:

1. A method for substantially simultaneously processing multiple portions of at least one substrate or portions of multiple substrates or multiple portions of at least one substrate and portions of multiple substrates, the method comprising:
    a) providing substantially simultaneously i) multiple portions of at least one substrate, or ii) portions of multiple substrates, or iii) multiple portions of at least one substrate and portions of multiple substrates to a reactor, the reactor including a precursor injector by which the i) multiple portions of at least one substrate, or ii) portions of multiple substrates, or iii) multiple portions of at least one substrate and portions of multiple substrates pass;
    b) heating through at least one aperture of a first aperture guard the i) multiple portions of at least one substrate, or ii) portions of multiple substrates, or iii) multiple portions of at least one substrate and portions of multiple substrates, the first aperture guard being positioned between a heater and the i) multiple portions of at least one substrate, or ii) portions of multiple substrates, or iii) multiple portions of at least one substrate and portions of multiple substrates;
    c) directing at least one temperature-regulated precursor from the precursor injector through at least one aperture of a second aperture guard at the heated i) multiple portions of at least one substrate, or ii) portions of multiple substrates, or iii) multiple portions of at least one substrate and portions of multiple substrates; and d) depositing a film that is a precursor to superconducting film or a superconducting film onto the heated i) multiple portions of at least one substrate, or ii) portions of multiple substrates, or iii) multiple portions of at least one substrate and portions of multiple substrates.

2. A method for substantially simultaneously processing multiple portions of at least one substrate or portions of multiple substrates or multiple portions of at least one substrate and portions of multiple substrates, the method comprising:
   a) providing at least one precursor injector to a CVD apparatus configured to substantially simultaneously processing multiple portions of at least one substrate or portions of multiple substrates or multiple portions of at least one substrate and portions of multiple substrates;
   b) providing substantially simultaneously i) multiple portions of at least one substrate, or ii) portions of multiple substrates, or iii) multiple portions of at least one substrate and portions of multiple substrates to the CVD apparatus;
   c) heating through at least one aperture of a first aperture guard the i) multiple portions of at least one substrate, or ii) portions of multiple substrates, or iii) multiple portions of at least one substrate and portions of multiple substrates, the first aperture guard being positioned between and a heater the ii) multiple portions of at least one substrate, or ii) portions of multiple substrates, or iii) multiple portions of at least one substrate and portions of multiple substrates;
   d) mixing at least one precursor composition;
   e) heating the mixed at least one precursor composition;
   f) directing the heated and mixed at least one precursor through at least one aperture of a second aperture guard at the heated i) multiple portions of at least one substrate, or ii) portions of multiple substrates, or iii) multiple portions of at least one substrate and portions of multiple substrates using the a precursor injector; and
   g) depositing a film that is a precursor to superconducting film or a superconducting film onto the heated i) multiple portions of at least one substrate, or ii) portions of multiple substrates, or iii) multiple portions of at least one substrate and portions of multiple substrates.

3. The method of claim 1, wherein heating the i) multiple portions of at least one substrate, or ii) portions of multiple substrates, or iii) multiple portions of at least one substrate and portions of multiple substrates is accomplished by a radiant heater, the radiant heater including a gaseous cooling mechanism for cooling a terminal of the radiant heater.

4. The method of claim 2, wherein heating the i) multiple portions of at least one substrate, or ii) portions of multiple substrates, or iii) multiple portions of at least one substrate and portions of multiple substrates is accomplished by a radiant heater including a cooling mechanism for a terminal of the radiant heater.

* * * * *

UNITED STATES PATENT AND TRADEMARK OFFICE
CERTIFICATE OF CORRECTION

PATENT NO. : 7,387,811 B2 Page 1 of 1
APPLICATION NO. : 10/946443
DATED : June 17, 2008
INVENTOR(S) : Venkat Selvamanickam It is certified that error appears in the above-identified patent and that said Letters Patent is hereby corrected as shown below:

Column 2:
Claim 2, line 27, please delete "between and a heater the ii)" and insert therefor --between a heater and the i)--.

Signed and Sealed this

Sixteenth Day of March, 2010

David J. Kappos
*Director of the United States Patent and Trademark Office*